United States Patent
Hinode et al.

(10) Patent No.: US 9,899,229 B2
(45) Date of Patent: Feb. 20, 2018

(54) SUBSTRATE PROCESSING APPARATUS

(71) Applicant: SCREEN HOLDINGS CO., LTD., Kamigyo-ku, Kyoto (JP)

(72) Inventors: Taiki Hinode, Kyoto (JP); Takashi Ota, Kyoto (JP); Naoki Fujiwara, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 0 days.

(21) Appl. No.: 15/190,113

(22) Filed: Jun. 22, 2016

(65) Prior Publication Data

US 2016/0300727 A1    Oct. 13, 2016

Related U.S. Application Data

(63) Continuation of application No. 14/179,131, filed on Feb. 12, 2014, now abandoned.

(30) Foreign Application Priority Data

Feb. 15, 2013 (JP) .................................. 2013-028125

(51) Int. Cl.
*H01L 21/311* (2006.01)
*C09K 13/04* (2006.01)
*H01L 21/67* (2006.01)

(52) U.S. Cl.
CPC ........ *H01L 21/31111* (2013.01); *C09K 13/04* (2013.01); *H01L 21/6708* (2013.01); *H01L 21/67051* (2013.01); *H01L 21/67109* (2013.01)

(58) Field of Classification Search
None
See application file for complete search history.

(56) References Cited

U.S. PATENT DOCUMENTS

| 6,096,233 A | 8/2000 | Taniyama et al. |
| 6,616,773 B1 | 9/2003 | Kuzumoto et al. |

(Continued)

FOREIGN PATENT DOCUMENTS

| CN | 1720106 A | 1/2006 |
| JP | 2007-258405 A | 10/2007 |

(Continued)

OTHER PUBLICATIONS

U.S. Office Action dated Feb. 24, 2016 issued in U.S. Appl. No. 14/179,131.

(Continued)

*Primary Examiner* — Shamim Ahmed
(74) *Attorney, Agent, or Firm* — McDermott Will & Emery LLP

(57) ABSTRACT

A substrate processing apparatus includes a phosphoric acid supply device for supplying phosphoric acid aqueous solution onto the upper surface of a substrate held on a spin chuck, a heater for emitting heat toward a portion of the upper surface of the substrate with the phosphoric acid aqueous solution being held on the substrate, a heater moving device for moving the heater to move a position heated by the heater within the upper surface of the substrate, a water nozzle for discharging water therethrough toward a portion of the upper surface of the substrate with the phosphoric acid aqueous solution being held on the substrate and a water nozzle moving device for moving the water nozzle to move the water landing position within the upper surface of the substrate.

12 Claims, 8 Drawing Sheets

(56) References Cited

U.S. PATENT DOCUMENTS

| | | |
|---|---|---|
| 7,479,205 B2 | 1/2009 | Okuda et al. |
| 2004/0137751 A1 | 7/2004 | Ou-Yang |
| 2004/0163683 A1 | 8/2004 | Sugimoto et al. |
| 2004/0206452 A1 | 10/2004 | Okuda et al. |
| 2008/0047577 A1 | 2/2008 | Goto et al. |
| 2012/0015523 A1 | 1/2012 | Leonhard et al. |
| 2012/0074102 A1* | 3/2012 | Magara .............. C11D 7/08 216/83 |
| 2012/0187083 A1 | 7/2012 | Hashizume |
| 2012/0260947 A1 | 10/2012 | Kaneko |
| 2012/0264308 A1 | 10/2012 | Watanabe et al. |
| 2013/0224956 A1 | 8/2013 | Negoro et al. |
| 2013/0267099 A1* | 10/2013 | Yu .................. H01L 21/6708 438/748 |
| 2014/0011367 A1* | 1/2014 | Nowling ........ H01L 21/31111 438/757 |

FOREIGN PATENT DOCUMENTS

| | | |
|---|---|---|
| JP | 2008-270402 A | 11/2008 |
| JP | 2012-023366 A | 2/2012 |
| JP | 2012-164949 A | 8/2012 |
| JP | 2012-204746 A | 10/2012 |
| JP | 2012-222254 A | 11/2012 |
| TW | 201306115 A | 2/2013 |

OTHER PUBLICATIONS

U.S. Office Action dated Jun. 19, 2015 issued in U.S. Appl. No. 14/179,131.

\* cited by examiner

SUBSTRATE PROCESSING APPARATUS

RELATED APPLICATIONS

This application is the Continuation Patent Application of U.S. patent application Ser. No. 14/179,131, filed Feb. 12, 2014, now abandoned, which in turn claims the benefit of Japanese Patent Application No. 2013-028125, filed on Feb. 15, 2013, the disclosure of which applications are incorporated by reference herein.

BACKGROUND OF THE INVENTION

1. Field of the Invention

The present invention relates to a substrate processing apparatus for processing a substrate. Substrates to be processed include, for example, semiconductor wafers, liquid crystal display device substrates, plasma display substrates, FED (Field Emission Display) substrates, optical disk substrates, magnetic disk substrates, magneto-optical disk substrates, photomask substrates, ceramic substrates, and photovoltaic cell substrates.

2. Description of Related Art

In a process of manufacturing semiconductor devices and liquid crystal display devices, etching treatment is performed as required in which a high-temperature phosphoric acid aqueous solution is supplied as an etchant onto the front surface of a substrate with a silicon nitride film and a silicon oxide film formed thereon to selectively etch the silicon nitride film.

US 2012/074102 A1 discloses a single substrate processing type substrate processing apparatus in which phosphoric acid aqueous solution of close to the boiling point is supplied onto a substrate held on a spin chuck. In this substrate processing apparatus, a high-temperature phosphoric acid aqueous solution of 100° C. or higher is supplied onto a substrate.

SUMMARY OF THE INVENTION

Moisture evaporation from the phosphoric acid aqueous solution supplied onto the substrate progresses gradually. During this time, the phosphoric acid aqueous solution undergoes a reaction of $2H_3PO_4 \rightarrow H_4P_2O_7 + H_2O$, that is, pyrophosphoric acid $H_4P_2O_7$ is generated from phosphoric acid $H_3PO_4$. Pyrophosphoric acid can etch the silicon oxide film. It is primarily desirable to etch only the silicon nitride film and leave unetched as large an area of the silicon oxide film as possible. Increasing the amount of etching of the silicon nitride film while suppressing the amount of etching of the silicon oxide film can result in a higher value of the etching selectivity ((etching amount of the silicon nitride film)/(etching amount of the silicon oxide film)). However, pyrophosphoric acid, if generated as mentioned above, can etch a portion of the silicon oxide film that is primarily desired to be left unetched, resulting in a reduction in the etching selectivity.

A preferred embodiment of the present invention provides a substrate processing apparatus including a substrate holding device for holding a substrate horizontally, a phosphoric acid supply device for supplying phosphoric acid aqueous solution onto the upper surface of the substrate held on the substrate holding device to form a liquid film of phosphoric acid aqueous solution covering the entire upper surface of the substrate, a heater for heating the liquid film of phosphoric acid aqueous solution from the upper surface side of the substrate, a heater moving device for moving the heater to move a position heated by the heater along the upper surface of the substrate, a water nozzle for discharging water therethrough toward the liquid film of phosphoric acid aqueous solution to cause the water to reach the liquid film and a water nozzle moving device for moving the water nozzle to move the water landing position along the upper surface of the substrate.

In accordance with the arrangement above, the phosphoric acid supply device supplies phosphoric acid aqueous solution as an etchant onto the upper surface of the substrate horizontally held on the substrate holding device. The heater then heats the liquid film of phosphoric acid aqueous solution from the upper surface side of the substrate, and the heater moving device moves a position heated by the heater along the upper surface of the substrate. This allows the liquid film of phosphoric acid aqueous solution to be heated without unevenness. The phosphoric acid aqueous solution on the substrate is thus heated and thereby the etching rate is increased.

The substrate processing apparatus also includes the water nozzle for discharging water therethrough toward the liquid film of phosphoric acid aqueous solution to cause the water to reach the liquid film and the water nozzle moving device for moving the water nozzle to move the water landing position along the upper surface of the substrate, whereby water is supplied toward the entire upper surface of the substrate.

The water nozzle discharges water therethrough toward the liquid film of phosphoric acid aqueous solution. The water nozzle moving device moves the water nozzle to move the water landing position with respect to the liquid film within the upper surface of the substrate. This allows the liquid film of phosphoric acid aqueous solution to be supplied with water without unevenness. Accordingly, pyrophosphoric acid ($H_4P_2O_7$) in the phosphoric acid aqueous solution decreases through a reaction of $H_4P_2O_7 + H_2O \rightarrow 2H_3PO_4$. This can suppress the reduction in the etching selectivity.

In a preferred embodiment of the present invention, the substrate processing apparatus may further include a water flow rate control valve for supplying water therethrough to the water nozzle at a flow rate at which the liquid film of phosphoric acid aqueous solution is maintained in a puddle shape on the substrate.

In accordance with the arrangement above, a puddle-shaped liquid film of phosphoric acid aqueous solution covering the entire upper surface of the substrate is formed. This causes the entire upper surface of the substrate to be supplied with phosphoric acid aqueous solution and etched.

Further, water is supplied onto the liquid film of phosphoric acid aqueous solution with the removal of phosphoric acid aqueous solution from the substrate being stopped. This can prevent the phosphoric acid aqueous solution, which has sufficient activity, from being removed from the substrate. This allows the phosphoric acid aqueous solution to be used efficiently. Further, since the amount of water supplied to the phosphoric acid aqueous solution on the substrate is accordingly small, the changes in the concentration and temperature of the phosphoric acid aqueous solution can be suppressed. It is therefore possible to suppress the fluctuation in the etching rate while suppressing the reduction in the etching selectivity.

In a preferred embodiment of the present invention, the heater moving device may be arranged to move the heater such that a region adjacent to the water landing position with respect to the upper surface of the substrate is heated.

In accordance with the arrangement above, the vicinity of the water landing position is heated by the heater. It is therefore possible to immediately compensate for the change in the temperature of the phosphoric acid aqueous solution due to the water supply. This can suppress the reduction in the in-plane etching rate uniformity.

In a preferred embodiment of the present invention, the substrate holding device may include a spin motor for rotating the substrate about a vertical line passing through a central portion of the upper surface of the substrate. The heater moving device may be arranged to move the heater such that a region downstream from the water landing position in the rotation direction of the substrate is heated.

In accordance with the arrangement above, the heater can heat the liquid film portion of phosphoric acid aqueous solution supplied with water immediately even if the substrate may be rotated. It is therefore possible to immediately compensate for the change in the temperature of the phosphoric acid aqueous solution due to the water supply. This can suppress the reduction in the in-planar etching rate uniformity.

In a preferred embodiment of the present invention, the substrate holding device may include a spin motor for rotating the substrate about a vertical line passing through a central portion of the upper surface of the substrate. The substrate processing apparatus may further include a control device for controlling the substrate holding device and the water nozzle moving device to move the water landing position between the central portion of the upper surface of the substrate and a peripheral portion of the upper surface of the substrate while rotating the substrate. The control device may be arranged to, when the rotation speed of the substrate is lower than a predetermined speed, move the water landing position between the central portion of the upper surface of the substrate and the peripheral portion of the upper surface of the substrate at a constant speed. The control device may be arranged to, when the rotation speed of the substrate is equal to or higher than the predetermined speed, reduce the moving speed of the water landing position as the water landing position comes closer to the central portion of the upper surface of the substrate or increase the moving speed of the water landing position as the water landing position moves away from the central portion of the upper surface of the substrate.

In accordance with the arrangement above, when the rotation speed of the substrate is lower than the predetermined speed, the control device moves the water landing position between the central portion of the upper surface of the substrate and the peripheral portion of the upper surface of the substrate at a constant speed. On the other hand, when the rotation speed of the substrate is equal to or higher than the predetermined speed, the control device reduces the moving speed of the water landing position as the water landing position comes closer to the central portion of the upper surface of the substrate. Accordingly, when the rotation speed of the substrate is equal to or higher than the predetermined speed, the central portion of the upper surface of the substrate is supplied with water at an amount larger than the peripheral portion of the upper surface of the substrate.

The present inventors have confirmed that when the substrate rotates at a high speed, the amount of etching is larger in the central portion of the upper surface of the substrate than in the peripheral portion of the upper surface of the substrate. The difference in the amount of etching can be for the reason that the concentration of phosphoric acid aqueous solution is higher in the central portion of the upper surface of the substrate than in the peripheral portion of the upper surface of the substrate. Hence, the control device is arranged to supply water onto the central portion of the upper surface of the substrate at an amount larger than onto the peripheral portion of the upper surface of the substrate to thereby reduce the concentration of phosphoric acid aqueous solution in the central portion of the upper surface of the substrate. The control device can thus be arranged to reduce the amount of etching in the central portion of the upper surface of the substrate. This can increase the etching uniformity.

The foregoing and other objects, features and advantages of the present invention will become more apparent from the description of preferred embodiments provided below with reference to the accompanying drawings.

DETAILED DESCRIPTION OF PREFERRED EMBODIMENTS

First Preferred Embodiment

Figure 1:
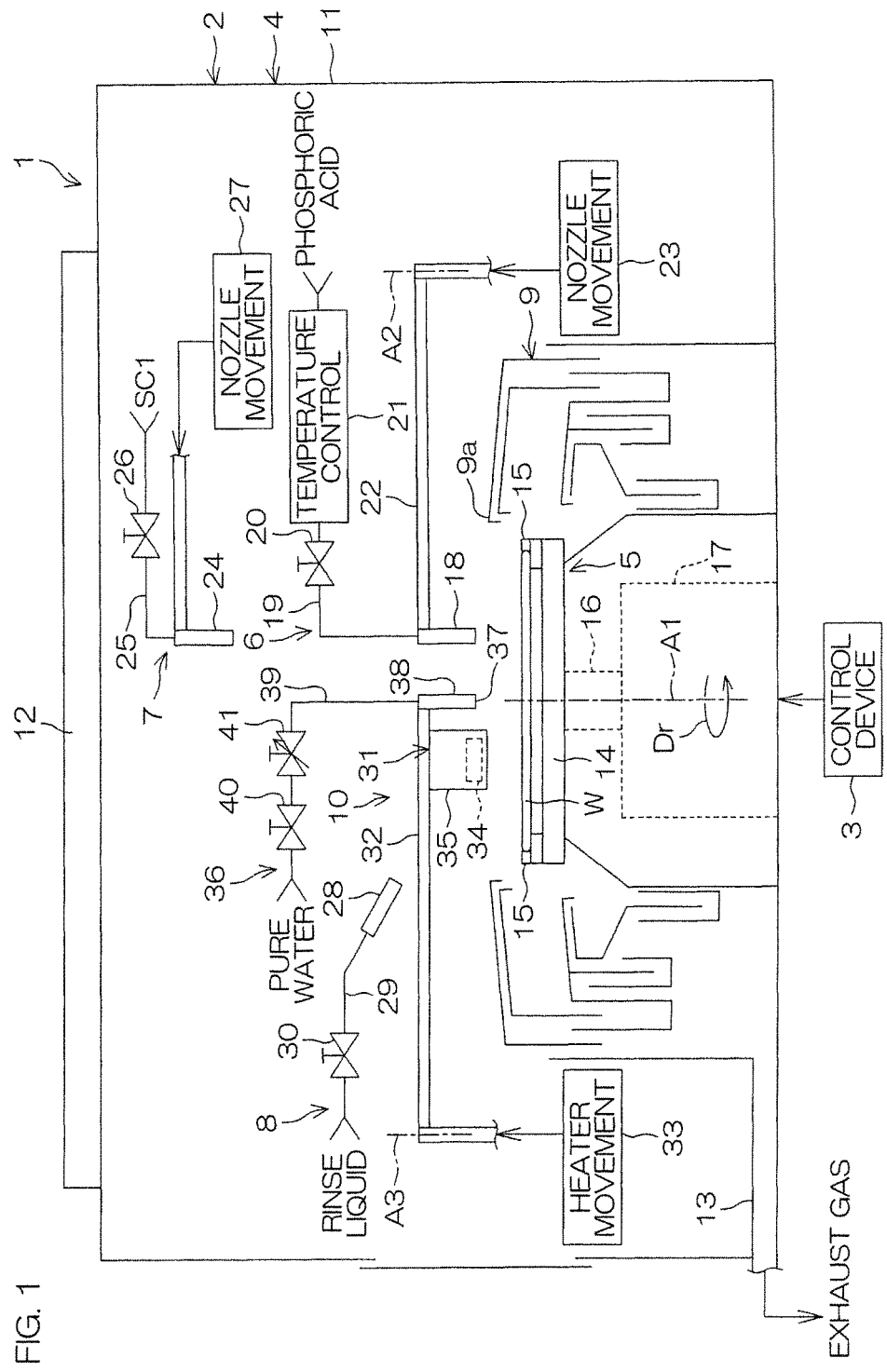
FIG. 1 is a horizontal schematic view of the interior of a processing unit included in a substrate processing apparatus according to a first preferred embodiment of the present invention.
Figure 2:
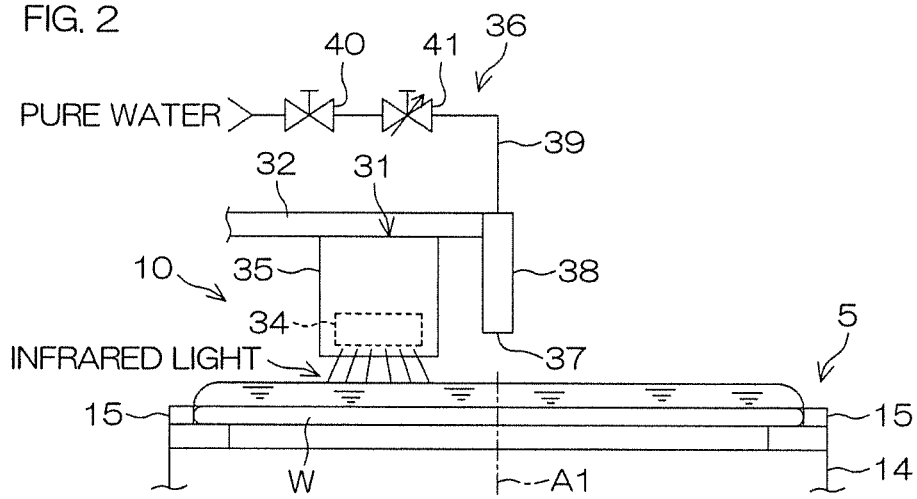
FIG. 2 is a horizontal schematic view showing a spin chuck, an infrared heater and a pure water nozzle.
Figure 3:
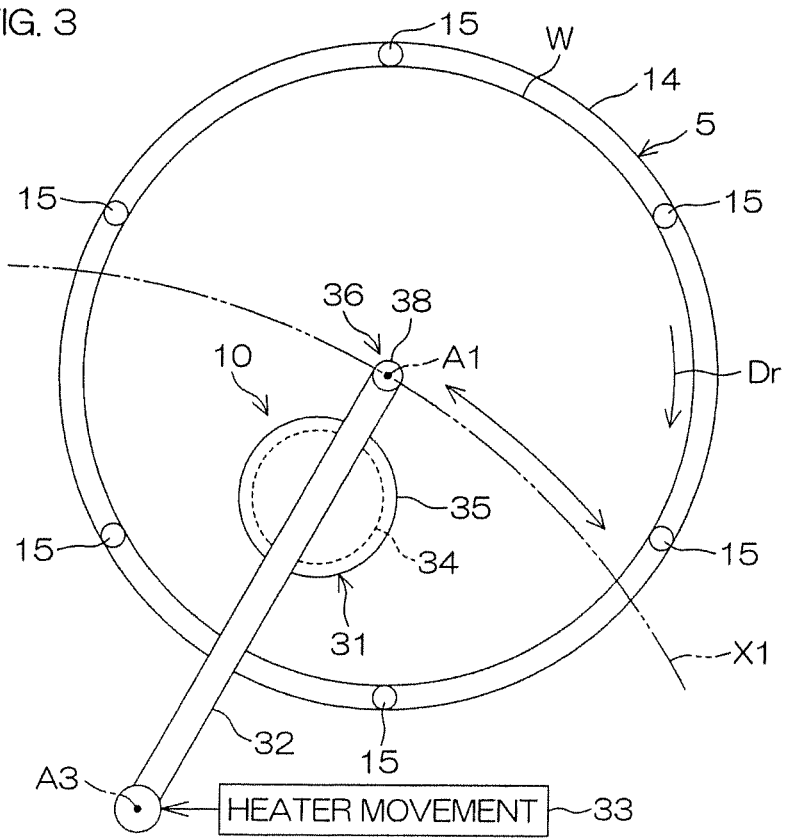
FIG. 3 is a schematic plan view showing the spin chuck, the infrared heater and the pure water nozzle.

FIG. 1 is a horizontal schematic view of the interior of a processing unit 2 included in a substrate processing apparatus 1 according to a first preferred embodiment of the present invention. FIG. 2 is a horizontal schematic view showing a spin chuck 5, an infrared heater 31 and a pure water nozzle 38. FIG. 3 is a schematic plan view showing the spin chuck 5, the infrared heater 31 and the pure water nozzle 38.

The substrate processing apparatus 1 is a single substrate processing type in which a disk-like substrate W such as a semiconductor wafer is processed one by one. The substrate processing apparatus 1 includes multiple processing units 2 (only one processing unit 2 is shown in FIG. 1) for processing the substrate W with processing fluid such as processing liquid and/or processing gas and a control device 3 for controlling the operation of devices and the opening/closing of valves included in the substrate processing apparatus 1. It is noted that the substrate processing apparatus 1 may include a single processing unit 2.

The processing unit 2 includes a box-shaped chamber 4 having an interior space, the spin chuck 5 for holding the substrate W horizontally within the chamber 4 and rotating the substrate W about a vertical rotation axis A1 passing through the center of the substrate W, processing liquid supply devices (phosphoric acid supply device 6, SC1 supply device 7, rinse liquid supply device 8 and pure water supply device 36) for supplying processing liquid onto the substrate W, a cylindrical cup 9 surrounding the spin chuck 5, and a heating device 10 for heating the substrate W.

As shown in FIG. 1, the chamber 4 includes a box-shaped partition wall 11 housing the spin chuck 5 and other components therein, an FFU 12 (fan filter unit 12) serving as a blower unit for feeding clean air (filtered air) into the partition wall 11 through an upper portion of the partition wall 11 and an exhaust duct 13 for discharging gas within the chamber 4 through a lower portion of the partition wall 11. The FFU 12 is disposed over the partition wall 11. The FFU 12 feeds clean air downward into the chamber 4 through the ceiling of the partition wall 11. The exhaust duct 13 is connected to a bottom portion of the cup 9 and guides gas within the chamber 4 toward an exhaust installation provided in the factory in which the substrate processing apparatus 1 is installed. Accordingly, a downflow (downward flow) flowing downwardly within the chamber 4 is formed by the FFU 12 and the exhaust duct 13. The substrate W is processed with such a downflow being formed within the chamber 4.

As shown in FIG. 1, the spin chuck 5 includes a horizontally held disk-like spin base 14, multiple chuck pins 15 for holding the substrate W horizontally over the spin base 14, a rotary shaft 16 extending downward from a central portion of the spin base 14 and a spin motor 17 serving as a substrate rotating device for rotating the rotary shaft 16 to rotate the substrate W and the spin base 14 about the rotation axis A1. The spin chuck 5 may be not only of a clamping type in which the multiple chuck pins 15 are brought into contact with the circumferential end surface of the substrate W, but also of a vacuum type in which the rear surface (lower surface) of the substrate W, on which no device is to be formed, is vacuumed onto the upper surface of the spin base 14 so that the substrate W is horizontally held.

As shown in FIG. 1, the cup 9 is disposed on an outer side (in the direction away from the rotation axis A1) further than the substrate W held on the spin chuck 5. The cup 9 surrounds the spin base 14. Processing liquid, when supplied onto the substrate W with the spin chuck 5 rotating the substrate W, is diverted from the substrate W. When the processing liquid is supplied onto the substrate W, an upper end portion 9a of the cup 9 opened upward is disposed at a position higher than that of the spin base 14. Accordingly, the processing liquid, such as chemical liquid and/or rinse liquid, diverted from the substrate W is received by the cup 9. The processing liquid received by the cup 9 is then sent to a collect apparatus or a waste liquid disposal apparatus not shown.

As shown in FIG. 1, the phosphoric acid supply device 6 includes a phosphoric acid nozzle 18 for discharging phosphoric acid aqueous solution therethrough toward the substrate W held on the spin chuck 5, a phosphoric acid pipe 19 for supplying phosphoric acid aqueous solution therethrough to the phosphoric acid nozzle 18, a phosphoric acid valve 20 for switching between start and stop of the supply of phosphoric acid aqueous solution from the phosphoric acid pipe 19 to the phosphoric acid nozzle 18 and a phosphoric acid temperature control device 21 for bringing the temperature of phosphoric acid aqueous solution to be supplied to the phosphoric acid nozzle 18 up to a temperature higher than the room temperature (a predetermined temperature within the range from 20° C. to 30° C.).

When the phosphoric acid valve 20 is opened, phosphoric acid aqueous solution, the temperature of which is controlled through the phosphoric acid temperature control device 21, is supplied through the phosphoric acid pipe 19 to the phosphoric acid nozzle 18 and discharged through the phosphoric acid nozzle 18. The phosphoric acid temperature control device 21 maintains the temperature of phosphoric acid aqueous solution at a constant temperature within the range from 80° C. to 215° C., for example. The phosphoric acid temperature control device 21 may control the temperature of phosphoric acid aqueous solution to the boiling point or lower at the current concentration. The phosphoric acid aqueous solution consists primarily of phosphoric acid, the concentration thereof being, for example, 50% to 100% and preferably around 80%.

As shown in FIG. 1, the phosphoric acid supply device 6 further includes a nozzle arm 22 with the phosphoric acid nozzle 18 attached to the tip portion thereof and a phosphoric acid nozzle moving device 23 for swinging the nozzle arm 22 about a swing axis A2 vertically extending around the spin chuck 5 and moving the nozzle arm 22 vertically upward and downward along the swing axis A2 to move the phosphoric acid nozzle 18 horizontally and vertically. The phosphoric acid nozzle moving device 23 moves the phosphoric acid nozzle 18 horizontally between a processing position where phosphoric acid aqueous solution discharged through the phosphoric acid nozzle 18 is supplied onto the upper surface of the substrate W and a retracted position where the phosphoric acid nozzle 18 is retracted around the substrate W in a plan view.

As shown in FIG. 1, the SC1 supply device 7 includes an SC1 nozzle 24 for discharging SC1 (mixture liquid containing $NH_4OH$ and $H_2O_2$) therethrough toward the substrate W held on the spin chuck 5, an SC1 pipe 25 for supplying SC1 therethrough to the SC1 nozzle 24, an SC1 valve 26 for switching between start and stop of the supply of SC1 from the SC1 pipe 25 to the SC1 nozzle 24 and an SC1 nozzle moving device 27 for moving the SC1 nozzle 24 horizontally and vertically. When the SC1 valve 26 is opened, SC1 supplied through the SC1 pipe 25 to the SC1 nozzle 24 is discharged through the SC1 nozzle 24. The SC1 nozzle moving device 27 moves the SC1 nozzle 29 horizontally between a processing position where SC1 discharged through the SC1 nozzle 24 is supplied onto the upper surface of the substrate W and a retracted position where the SC1 nozzle 24 is retracted around the substrate W in a plan view.

As shown in FIG. 1, the rinse liquid supply device 8 includes a rinse liquid nozzle 28 for discharging rinse liquid therethrough toward the substrate W held on the spin chuck 5, a rinse liquid pipe 29 for supplying rinse liquid therethrough to the rinse liquid nozzle 28 and a rinse liquid valve 30 for switching between start and stop of the supply of rinse liquid from the rinse liquid pipe 29 to the rinse liquid nozzle 28. The rinse liquid nozzle 28 is a fixed nozzle arranged to discharge rinse liquid therethrough with the discharge port of the rinse liquid nozzle 28 kept still. The rinse liquid supply device 8 may include a rinse liquid nozzle moving device for moving the rinse liquid nozzle 28 to move the position at which rinse liquid lands with respect to the upper surface of the substrate W.

When the rinse liquid valve 30 is opened, rinse liquid supplied through the rinse liquid pipe 29 to the rinse liquid nozzle 28 is discharged through the rinse liquid nozzle 28 toward a central portion of the upper surface of the substrate W. The rinse liquid is, for example, pure water (deionized water). The rinse liquid is not limited to pure water, but may be carbonated water, electrolyzed ionic water, hydrogen water, ozone water, IPA (isopropyl alcohol), or hydrochloric acid water of a dilute concentration (e.g. about 10 to 100 ppm).

As shown in FIG. 1, the heating device 10 includes a radiant heating device for radiationally heating the substrate W. The radiant heating device includes the infrared heater 31 for irradiating the substrate W with infrared light, a heater arm 32 with the infrared heater 31 attached to the tip portion thereof and a heater moving device 33 for moving the heater arm 32.

As shown in FIG. 2, the infrared heater 31 includes an infrared lamp 34 for emitting infrared light and a lamp housing 35 housing the infrared lamp 34 therein. The infrared lamp 34 is disposed within the lamp housing 35. As shown in FIG. 3, the lamp housing 35 is smaller than the substrate W in a plan view. Accordingly, the infrared lamp 34 disposed within the lamp housing 35 is also smaller than the substrate W in a plan view. The infrared lamp 34 and the lamp housing 35 are attached to the heater arm 32. Accordingly, the infrared lamp 34 and the lamp housing 35 move together with the heater arm 32.

The infrared lamp 34 includes a filament and a quartz tube housing the filament therein. The infrared lamp 34 (e.g. halogen lamp) in the heating device 10 may be a carbon heater or another type of heating element. At least a portion of the lamp housing 35 is made of a material having optical transparency and heat resistance, such as quartz.

When the infrared lamp 34 emits light, light containing infrared light is emitted from the infrared lamp 34. The light containing infrared light transmits through the lamp housing 35 to be emitted from the outer surface of the lamp housing 35 or heats the lamp housing 35 to emit radiant light from the outer surface of the lamp housing 35. The substrate W and a liquid film of phosphoric acid aqueous solution held on the upper surface of the substrate W are heated by the transmitted light and radiant light from the outer surface of the lamp housing 35. Although transmitted or radiant light containing infrared light is thus emitted from the outer surface of the lamp housing 35, the infrared lamp 34 will hereinafter be described focusing on infrared light transmitting through the outer surface of the lamp housing 35.

As shown in FIG. 2, the lamp housing 35 has a bottom wall parallel to the upper surface of the substrate W. The infrared lamp 34 is disposed over the bottom wall. The lower surface of the bottom wall includes a flat substrate opposing surface parallel to the upper surface of the substrate W. With the infrared heater 31 being disposed over the substrate W, the substrate opposing surface of the lamp housing 35 is vertically opposed to the upper surface of the substrate W with a space therebetween. Infrared light, when emitted from the infrared lamp 34 in this state, transmits through the substrate opposing surface of the lamp housing 35 to irradiate the upper surface of the substrate W. The substrate opposing surface has, for example, a circular shape with a diameter smaller than the radius of the substrate W. The substrate opposing surface is not limited to having a circular shape, but may have a rectangular shape with a longitudinal length equal to or greater than the radius of the substrate W or a shape other than circular or rectangular.

As shown in FIG. 1, the heater moving device 33 holds the infrared heater 31 at a predetermined height. The heater moving device 33 moves the infrared heater 31 vertically. Further, the heater moving device 33 swings the heater arm 32 about a swing axis A3 vertically extending around the spin chuck 5 to move the infrared heater 31 horizontally. This causes a heated region irradiated and heated with light such as infrared light (a portion within the upper surface of the substrate W) to move within the upper surface of the substrate W. As shown in FIG. 2, the heater moving device 33 moves the tip portion of the heater arm 32 horizontally along an arc-like trajectory X1 passing through the center of the substrate W in a plan view. Accordingly, the infrared heater 31 moves within a horizontal plane including the space over the spin chuck 5.

The heated region within the upper surface of the substrate W is irradiated with infrared light from the infrared heater 31. With the infrared heater 31 emitting light, the control device 3 controls the heater moving device 33 to swing the infrared heater 31 about the swing axis A3 while controlling the spin chuck 5 to rotate the substrate W. This causes the heated region as a result of the infrared heater 31 to scan the upper surface of the substrate W. As a result, light such as infrared light is absorbed by at least one of the upper surface of the substrate W and the processing liquid film held on the upper surface of the substrate W and thus radiant heat is transferred from the infrared lamp 34 to the substrate W. When the infrared lamp 34 thus emits light with liquid such as processing liquid being held on the substrate W, the temperature of the substrate W rises and accordingly the temperature of the liquid on the substrate W also rises. Alternatively, the liquid on the substrate W itself is heated to undergo a temperature rise.

As shown in FIG. 1, the processing unit 2 includes the pure water supply device 36 for discharging pure water toward the substrate W. The pure water supply device 36 includes the pure water nozzle 38 for discharging pure water through a pure water discharge port 37 toward the substrate W, a pure water pipe 39 for supplying pure water therethrough to the pure water nozzle 38, a pure water valve 40 for switching between start and stop of the supply of pure water from the pure water pipe 39 to the pure water nozzle 38, and a pure water flow rate control valve 41 for controlling the flow rate of pure water supplied from the pure water pipe 39 to the pure water nozzle 38.

The pure water nozzle 38 includes single pure water discharge port 37 for intermittently discharging pure water therethrough and preferably pure water droplets one by one. The pure water nozzle 38 may include multiple pure water discharge ports 37. Pure water drops vertically downward from the pure water discharge port 37 serving as a droplet discharge port. Therefore, when the pure water discharge port 37 is vertically opposed to the upper surface of the substrate W, pure water droplets drop vertically downward to the upper surface of the substrate W. Switching between start and stop of the discharge of droplets is performed by the pure water valve 40 and the size of the droplets is adjusted with the degree of opening of the pure water flow rate control valve 41.

As shown in FIG. 1, the pure water nozzle 38 is attached to the heater arm 32. Accordingly, the pure water nozzle 38 moves horizontally and vertically together with the infrared heater 31. The infrared heater 31 is attached to the heater arm 32 closer to the base of the heater arm 32 than the pure water nozzle 38. This results in the horizontal distance from the swing axis A3 to the pure water nozzle 38 is longer than the horizontal distance from the swing axis A3 to the infrared heater 31.

As shown in FIG. 3, when the heater arm 32 is swung by the heater moving device 33, pure water from the pure water nozzle 38 lands on the upper surface of the substrate W along the arc-like trajectory X1 passing through the center of the substrate W. On the other hand, the infrared heater 31 moves over the upper surface of the substrate W with a swing radius smaller than the trajectory X1. The heater moving device 33 moves not only the infrared heater 31 but also the pure water nozzle 38 along the upper surface of the substrate W. This allows the heater moving device 33 to serve also as a pure water supply position moving device.

As shown in FIG. 3, the control device 3 controls the spin chuck 5 to rotate the substrate W in a certain rotation direction Dr.

During a heating step and a pure water supply step (step S4 in FIG. 4) to be described hereinafter, the control device 3 makes the heater arm 32 swing back and forth between the central portion of the upper surface of the substrate W (the position shown in FIG. 3) and the peripheral portion of the upper surface of the substrate W such that the position at which pure water discharged through the pure water nozzle 38 lands moves back and forth within the range indicated by the arrow in FIG. 3. This allows pure water discharged through the pure water nozzle 38 to land on a region of phosphoric acid aqueous solution upstream from the region irradiated with infrared light by the infrared heater 31 with respect to the rotation direction Dr of the substrate W.

Pure water droplets dropping on the upper surface of the rotating substrate W move in the rotation direction Dr of the substrate W. That is, the pure water droplets move downstream in the rotation direction Dr of the substrate W. The infrared heater 31 irradiates and heats with light such as infrared light a region downstream from the pure water landing position. Accordingly, when pure water droplets drop on a partial region within the upper surface of the substrate W with the substrate W rotating and the infrared heater 31 emitting light such as infrared light, the region rapidly moves to the heated region to be heated. As a result, even if droplets with a temperature lower than that of the substrate W may be supplied onto the substrate W, the temperature of the substrate W is approximated to the original temperature (the temperature before the droplets are supplied).

Figure 4:
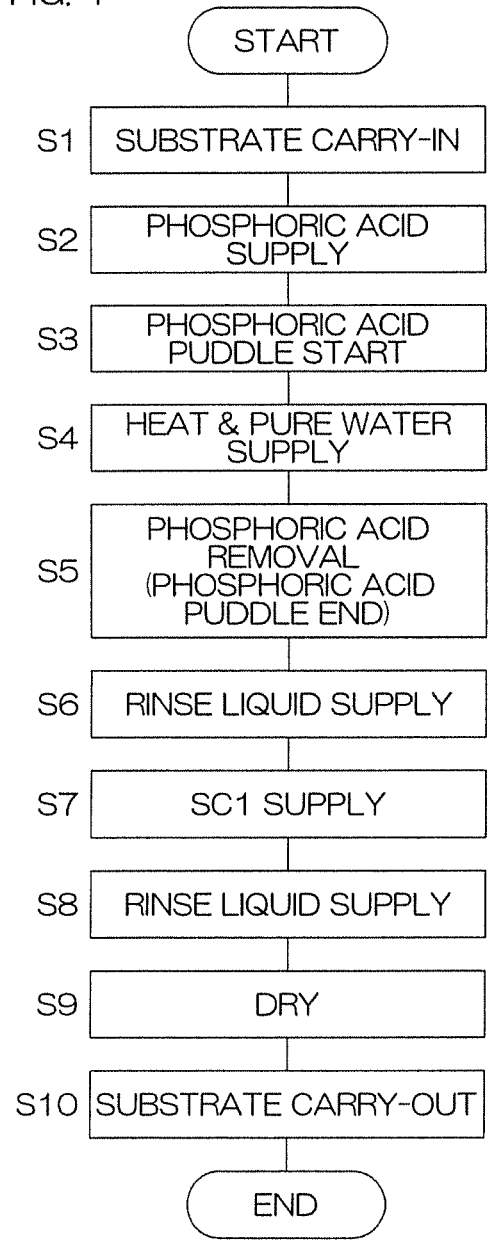
FIG. 4 is a process flow chart illustrating an example of substrate processing performed by the processing unit.
Figure 5A:
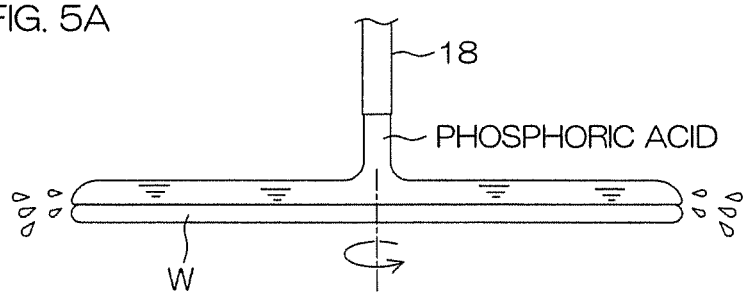
FIG. 5A is a schematic view showing a substrate during a phosphoric acid supply step.
Figure 5B:
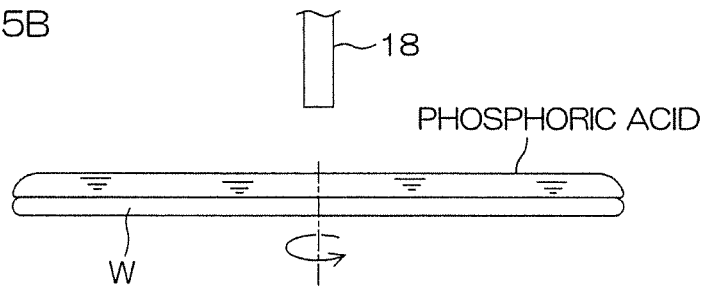
FIG. 5B is a schematic view showing the substrate during a puddle step.
Figure 5C:
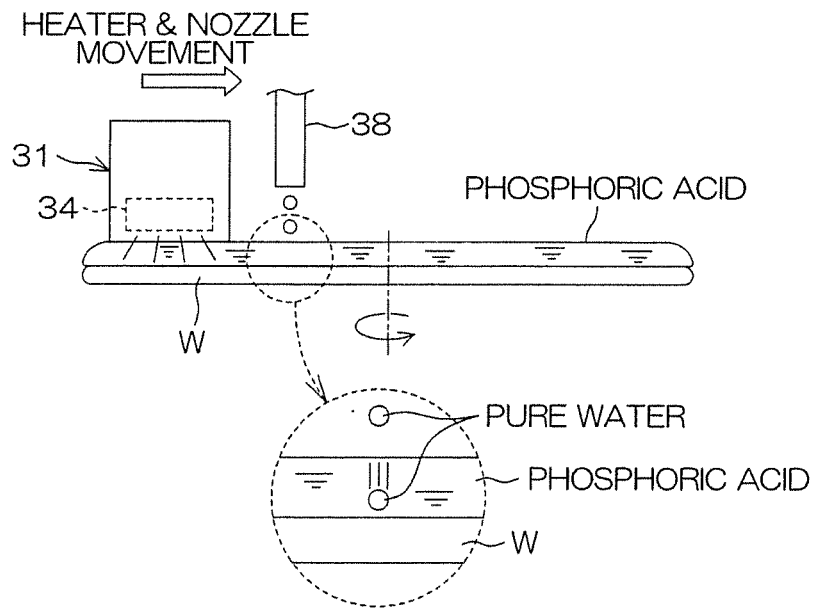
FIG. 5C is a schematic view showing the substrate during the puddle step, a heating step and a pure water supply step.

FIG. 4 is a process flow chart illustrating an example of processing of the substrate W performed by the processing unit 2. FIGS. 5A, 5B and 5C are schematic views showing the substrate W being processed. Reference will be made to FIG. 1 below. Reference to FIGS. 4, 5A, 5B and 5C will be made appropriately.

Hereinafter will be described selective etching in which phosphoric acid aqueous solution is supplied onto a surface of a substrate W (silicon wafer) with an LP-SiN (Low Pressure-Silicon Nitride) thin film as an example silicon nitride film and an LP-TEOS (Low Pressure-Tetraethyl Orthosilicate) thin film as an example silicon oxide film formed superficially thereon to selectively etch the LP-SiN thin film. The silicon oxide film is not limited to a TEOS thin film, but may be a thermally oxidized film or a silicate glass-based oxide film.

In processing of the substrate W by the processing unit 2, a carry-in step (step S1 in FIG. 4) is performed to carry the substrate W into the chamber 4. Specifically, with all the nozzles being retracted from over the spin chuck 5, the control device 3 controls a transfer robot (not shown) holding the substrate W to move its hand into the chamber 4. The control device 3 then controls the transfer robot to place the substrate W on the spin chuck 5. Thereafter, the control device 3 controls the spin chuck 5 to hold the substrate W thereon. Subsequently, the control device 3 controls the spin chuck 5 to start rotating the substrate W at a low speed (e.g. 1 to 30 rpm). After the substrate W is placed on the spin chuck 5, the control device 3 controls the transfer robot to retract its hand from inside the chamber 4.

Next, a phosphoric acid supply step (step S2 in FIG. 4) is performed as an etching step to supply phosphoric acid aqueous solution, an example of etching liquid, onto the substrate W. Specifically, the control device 3 controls the phosphoric acid nozzle moving device 23 to move the phosphoric acid nozzle 18 from the retracted position to the processing position. This causes the phosphoric acid nozzle 18 to be disposed over the substrate W on the rotation axis A1 of the substrate W. Thereafter, the control device 3 opens the phosphoric acid valve 20 to cause phosphoric acid aqueous solution, the temperature of which is controlled by the phosphoric acid temperature control device 21, to be discharged through the phosphoric acid nozzle 18 toward the upper surface of the rotating substrate W. In this state, the control device 3 controls the phosphoric acid nozzle moving device 23 to move the position at which the phosphoric acid aqueous solution lands with respect to the upper surface of the substrate W between the central portion and the peripheral portion.

As shown in FIG. 5A, the phosphoric acid aqueous solution discharged through the phosphoric acid nozzle 18 lands on the upper surface of the substrate W and then, due to a centrifugal force, flows outward along the upper surface of the substrate W. The phosphoric acid aqueous solution is thus supplied over the entire upper surface of the substrate W, so that a liquid film of phosphoric acid aqueous solution covering the entire upper surface of the substrate W is formed on the substrate W. This causes the upper surface of the substrate W to be etched, that is, the silicon nitride film to be removed selectively. Further, since with the substrate W rotating, the control device 3 moves the position at which the phosphoric acid aqueous solution lands with respect to the upper surface of the substrate W between the central portion and the peripheral portion, the phosphoric acid aqueous solution landing position passes across and scans the entire upper surface of the substrate W. This causes the phosphoric acid aqueous solution discharged through the phosphoric acid nozzle 18 to be directly supplied over the entire upper surface of the substrate W, so that the entire upper surface of the substrate W is processed uniformly.

Next, a puddle step (step S3 in FIG. 4) is performed to hold the liquid film of phosphoric acid aqueous solution on the substrate W with the supply of phosphoric acid aqueous solution onto the substrate W being stopped. Specifically, the control device 3 controls the spin chuck 5 to keep the substrate W still or decelerate the rotation of the substrate W to a rotation speed (e.g. lower than 10 rpm) lower than the rotation speed of the substrate W during the phosphoric acid supply step with the entire upper surface of the substrate W being covered with the liquid film of phosphoric acid aqueous solution. As a result, the centrifugal force acting on the phosphoric acid aqueous solution on the substrate W decreases and thereby the amount of phosphoric acid aqueous solution removed from the substrate W decreases. With the substrate W being kept still or rotating at the low rotation speed, the control device 3 closes the phosphoric acid valve 20 to stop the discharge of phosphoric acid aqueous solution through the phosphoric acid nozzle 18. This causes, as shown in FIG. 5B, a puddle-shaped liquid film of phosphoric acid aqueous solution covering the entire upper surface of the substrate W to be held on the substrate W with the supply of phosphoric acid aqueous solution onto the substrate W being stopped. After the supply of phosphoric acid aqueous solution onto the substrate W is stopped, the control device 3 controls the phosphoric acid nozzle moving device 23 to retract the phosphoric acid nozzle 18 from over the spin chuck 5.

Next, a heating step (step S4 in FIG. 4) to heat the phosphoric acid aqueous solution on the substrate W and a pure water supply step (step S4 in FIG. 4) to supply pure water droplets onto the phosphoric acid aqueous solution on the substrate W are performed in parallel to the puddle step. Specifically, the control device 3 controls the infrared heater 31 to start light emitting. Thereafter, the control device 3 controls the heater moving device 33 to move the infrared heater 31 and the pure water nozzle 38 from the retracted position to the processing position. After the infrared heater 31 and the pure water nozzle 38 are disposed over the substrate W, the control device 3 controls the heater moving device 33 to move the infrared heater 31 and the pure water nozzle 38 horizontally such that the region with respect to the upper surface of the substrate W irradiated with infrared light moves back and forth between the central portion and the peripheral portion of the substrate W within the range indicated by the arrow in FIG. 3. At this time, the control device 3 may move the infrared heater 31 with the substrate opposing surface of the infrared heater 31 being in contact with the liquid film of phosphoric acid aqueous solution on the substrate W or with the lower surface of the infrared heater 31 being separated by a predetermined distance from the liquid film of phosphoric acid aqueous solution on the substrate W.

The control device 3 opens and closes the pure water valve 40 multiple times while the position irradiated with infrared light moves back and forth between the central portion of the upper surface of the substrate W and the peripheral portion of the upper surface of the substrate W. This causes, as shown in FIG. 5C, the pure water landing position to move between the central portion of the upper surface of the substrate W and the peripheral portion of the upper surface of the substrate W and multiple pure water droplets to be discharged one by one through the pure water discharge port 37 of the pure water nozzle 38. With the removal of phosphoric acid aqueous solution from the substrate W being stopped, the multiple pure water droplets are thus supplied to multiple positions within the upper surface of the substrate W. After the substrate W is heated by the infrared heater 31 over a predetermined period of time, the control device 3 stops the discharge of droplets through the pure water nozzle 38 and retracts the infrared heater 31 and the pure water nozzle 38 from over the substrate W. Thereafter, the control device 3 controls the infrared heater 31 to stop light emitting.

Since with the substrate W rotating, the control device 3 moves the position with respect to the upper surface of the substrate W irradiated with infrared light back and forth between the central portion and the peripheral portion, the substrate W is uniformly heated. Accordingly, the liquid film of phosphoric acid aqueous solution covering the entire upper surface of the substrate W is also uniformly heated. The temperature to which the substrate W is to be heated by the infrared heater 31 is set to a temperature equal to or higher than the boiling point of phosphoric acid aqueous solution at the current concentration (100° C. or higher and, for example, a predetermined temperature within the range from 190° C. to 160° C.). The phosphoric acid aqueous solution on the substrate W is therefore heated to the boiling point at the current concentration and maintained in the boiled state. Particularly, in the case where the temperature to which the substrate W is to be heated by the infrared heater 31 is set higher than the boiling point of phosphoric acid aqueous solution at the current concentration, the temperature of the interface between the substrate W and the phosphoric acid aqueous solution is maintained at a temperature higher than the boiling point, which enhances the etching of the substrate W.

Since the phosphoric acid aqueous solution is maintained in a boiled state in the heating step (S4), a large amount of moisture is evaporated from the phosphoric acid aqueous solution. With the evaporation, a reaction of $2H_3PO_4 \rightarrow H_4P_2O_7 + H_2O$ causes pyrophosphoric acid ($H_4P_2O_7$) to be generated, which may etch the silicon oxide film. However, the control device 3 supplies pure water onto the phosphoric acid aqueous solution on the substrate W at an amount corresponding to the amount of water evaporated from the phosphoric acid aqueous solution, which replenishes the phosphoric acid aqueous solution with evaporated moisture and thereby reduces the change in the concentration of the phosphoric acid aqueous solution. This suppresses the fluctuation in the etching rate. Further, pyrophosphoric acid once generated in the phosphoric acid aqueous solution decreases through reaction with the replenished pure water, which suppresses or prevents the reduction in the etching selectivity.

The etching of the silicon oxide film is thus suppressed efficiently by reducing pyrophosphoric acid existing at the interface between the substrate W and the phosphoric acid aqueous solution. In the pure water supply step, pure water is supplied onto the phosphoric acid aqueous solution on the substrate W in the form of droplets. Since the supplied pure water droplets move without breaking up in the phosphoric acid aqueous solution (see FIG. 5C), it is possible to reliably cause the pure water to reach the interface between the substrate W and the phosphoric acid aqueous solution and to reliably reduce pyrophosphoric acid existing at the interface between the substrate W and the phosphoric acid aqueous solution. This reliably suppresses or prevents the reduction in the etching selectivity.

Pure water with which to replenish the phosphoric acid aqueous solution may be atomized through the pure water discharge port 37. However, since atomized pure water would mostly be absorbed at the superficial layer of the phosphoric acid aqueous solution, it may be impossible to cause a sufficient amount of pure water to reach the interface between the substrate W and the phosphoric acid aqueous solution. It is therefore desirable to discharge droplet pure water through the pure water discharge port 37. In addition, since the phosphoric acid aqueous solution on the substrate W is heated to 100° C. or higher, it is initially difficult for atomized pure water, which is easily evaporated, to reach the superficial layer of the phosphoric acid aqueous solution. Also in view of the above, it is desirable to discharge droplet pure water through the pure water discharge port 37.

Pure water with which to replenish the phosphoric acid aqueous solution may be continuously discharged through the pure water discharge port 37 or may be intermittently discharged through the pure water discharge port 37. It is, however, difficult to supply a small amount of water continuously at high accuracy. On the other hand, in the case of intermittent discharging of pure water, it is possible to supply a small amount of water at relatively high accuracy. For this reason, intermittently discharging pure water through the pure water discharge port 37 allows the changes in the concentration and temperature of the phosphoric acid aqueous solution to be more reliably suppressed.

It is noted that in the case of performing substrate heating and pure water supply in step S4 with the substrate opposing surface of the infrared heater 31 being in contact with the liquid film of phosphoric acid aqueous solution on the substrate W as shown in FIG. 5C, it is desirable that the supplied pure water is not interposed between the liquid film of phosphoric acid aqueous solution and the substrate opposing surface of the infrared heater 31. This is for the reason that pure water has a boiling point lower than that of phosphoric acid aqueous solution and, if interposed as above, pure water might be evaporated instantaneously due to heating by the infrared heater 31.

Next, a phosphoric acid removing step (step S5 in FIG. 4) is performed to remove the phosphoric acid aqueous solution on the substrate W. Specifically, with the supply of liquid onto the substrate W being stopped, the control device 3 controls the spin chuck 5 to rotate the substrate W at a rotation speed (e.g. 500 to 3000 rpm) higher than the rotation speed of the substrate W during the puddle step. This causes a centrifugal force larger than in the puddle step to act on the phosphoric acid aqueous solution on the substrate W, whereby the phosphoric acid aqueous solution on the substrate W is diverted from the substrate W. Also, the phosphoric acid aqueous solution scattered around the substrate W is received by the cup 9 and guided to the collect apparatus via the cup 9. The phosphoric acid aqueous solution guided to the collect apparatus is then resupplied to the substrate W. This reduces the amount of use of phosphoric acid aqueous solution.

Next, a first rinse liquid supply step (step S6 in FIG. 4) is performed to supply pure water, an example of rinse liquid, onto the substrate W. Specifically, the control device 3 opens the rinse liquid valve 30 so that pure water is discharged through the rinse liquid nozzle 28 toward the central portion of the upper surface of the substrate W, while rotating the substrate W. This causes a liquid film of pure water covering the entire upper surface of the substrate W to be formed and the phosphoric acid aqueous solution remaining on the substrate W to be rinsed off by the pure water. When a predetermined period of time elapses after the rinse liquid valve 30 is opened, the control device 3 closes the rinse liquid valve 30 to stop pure water discharging.

Next, a chemical liquid supply step (step S7 in FIG. 4) is performed to supply SC1, an example of chemical liquid, onto the substrate W. Specifically, the control device 3 controls the SC1 nozzle moving device 27 to move the SC1 nozzle 24 from the retracted position to the processing position. After the SC1 nozzle 24 is disposed over the substrate W, the control device 3 opens the SC1 valve 26 to discharge SC1 through the SC1 nozzle 24 toward the upper surface of the rotating substrate W. In this state, the control device 3 controls the SC1 nozzle moving device 27 to move the position at which SC1 lands on, with respect to the upper surface of the substrate W, back and forth between the central portion and the peripheral portion. When a predetermined period of time elapses after the SC1 valve 26 is opened, the control device 3 closes the SC1 valve 26 to stop SC1 discharging. The control device 3 then controls the SC1 nozzle moving device 27 to retract the SC1 nozzle 24 from over the substrate W.

The SC1 discharged through the SC1 nozzle 24 lands on the upper surface of the substrate W and then, due to a centrifugal force, flows outward along the upper surface of the substrate W. Accordingly, the pure water on the substrate W is washed away outward by the SC1 and removed to around the substrate W. This causes the liquid film of pure water on the substrate W to be replaced with the liquid film of SC1 covering the entire upper surface of the substrate W. Further, since with the substrate W rotating, the control device 3 moves the position at which the SC1 lands on, with respect to the upper surface of the substrate W, between the central portion and the peripheral portion, the SC1 landing position passes across and scans the entire upper surface of the substrate W. This causes the SC1 discharged through the SC1 nozzle 24 to be sprayed directly over the entire upper surface of the substrate W, so that the entire upper surface of the substrate W is processed uniformly.

Next, a second rinse liquid supply step (step S8 in FIG. 4) is performed to supply pure water, an example of rinse liquid, onto the substrate W. Specifically, the control device 3 opens the rinse liquid valve 30 so that pure water is discharged through the rinse liquid nozzle 28 toward the central portion of the upper surface of the substrate W, while rotating the substrate W. Accordingly, the SC1 on the substrate W is washed away outward by the pure water and removed to around the substrate W. This causes the liquid film of SC1 on the substrate W to be replaced with the liquid film of pure water covering the entire upper surface of the substrate W. When a predetermined period of time elapses after the rinse liquid valve 30 is opened, the control device 3 closes the rinse liquid valve 30 to stop pure water discharging.

Next, a drying step (step S9 in FIG. 4) is performed to dry the substrate W. Specifically, the control device 3 controls the spin chuck 5 to accelerate the rotation of the substrate W and thereby to rotate the substrate W at a rotation speed (e.g. 500 to 3000 rpm) higher than the rotation speed up to the second rinse liquid supply step. This causes a large centrifugal force to act on the liquid on the substrate W, so that the liquid adhering to the substrate W is diverted from the substrate W. The liquid is thus removed from the substrate W and hence the substrate W is dried. When a predetermined period of time elapses after the substrate W starts to rotate at a high speed, the control device 3 stops the rotation of the substrate W by the spin chuck 5.

Next, a carry-out step (step S10 in FIG. 4) is performed to carry the substrate W out of the chamber 4. Specifically, the control device 3 controls the spin chuck 5 to release the substrate W held thereon. Thereafter, with all the nozzles being retracted from over the spin chuck 5, the control device 3 controls the transfer robot (not shown) to move its hand into the chamber 4. The control device 3 then controls the transfer robot to hold the substrate W on the spin chuck 5 with its hand. Thereafter, the control device 3 controls the transfer robot to retract its hand from inside the chamber 4. The processed substrate W is thus carried out of the chamber 4.

Figure 6:
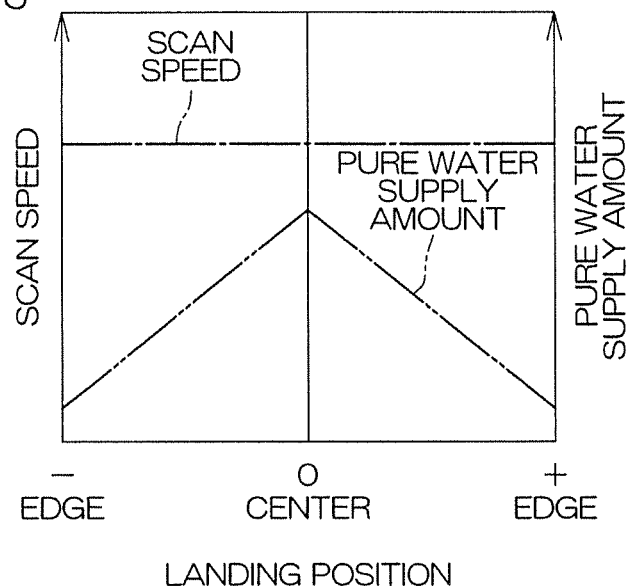
FIG. 6 is a graph showing an example of the relationship between the radial distance from the center of the substrate to the pure water landing position and the moving speed of the pure water landing position as well as the amount of pure water supply.
Figure 7:
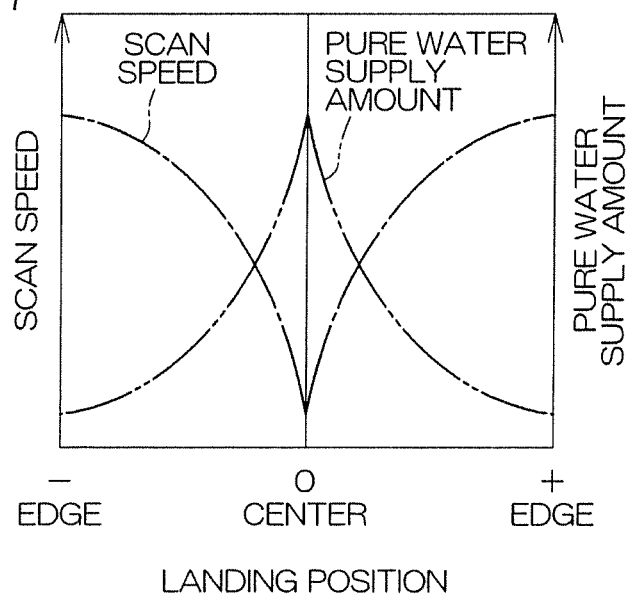
FIG. 7 is a graph showing another example of the relationship between the radial distance from the center of the substrate to the pure water landing position and the moving speed of the pure water landing position as well as the amount of pure water supply.

FIG. 6 is a graph showing an example of the relationship between the radial distance from the center of the substrate W to the pure water landing position and the radial moving speed of the pure water landing position as well as the amount of pure water supply. FIG. 7 is a graph showing another example of the relationship between the radial distance from the center of the substrate W to the pure water landing position and the radial moving speed of the pure water landing position as well as the amount of pure water supply.

The control device 3 controls the heater moving device 33 to move the pure water nozzle 38 horizontally and thereby to move the position at which pure water lands on, with respect to the upper surface of the substrate W. Further, the control device 3 controls the degree of opening of the pure water flow rate control valve 41 to change the size (volume) of droplets discharged through the pure water nozzle 38 and thereby to control the flow rate of pure water discharged through the pure water discharge port 37.

It is desirable that the amount of etching of the silicon nitride film be uniform over the entire upper surface of the substrate W. It is therefore necessary to increase the in-plane etching rate uniformity. In other words, the silicon nitride film is required to have substantially the same etching rate in both the peripheral portion and the central portion of the upper surface of the substrate W. Since the etching rate of the silicon nitride film depends on the concentration of phosphoric acid aqueous solution, pure water replenishment is required to make the concentration constant over the entire upper surface of the substrate W. It is desirable that when the substrate W stops or substantially stops (rotates at several revolutions per minute), the speed of the pure water landing position moving radially on the upper surface of the substrate W (hereinafter referred to as substrate traversing speed) be constant and the flow rate of pure water discharged through the pure water discharge port 37 be constant. This allows both the peripheral portion and the central portion of the upper surface of the substrate W to be supplied with substantially the same amount of pure water per unit area and thereby the concentration of phosphoric acid aqueous solution to be uniformized over the upper surface of the substrate W. It is therefore possible to increase the in-plane etching rate uniformity.

Meanwhile, when the substrate W is rotated at a relatively high speed during the above-described pure water supply step, an approximately equivalent centrifugal force may cause a concentration unevenness in the radial direction of the substrate W to act on the phosphoric acid aqueous solution on the substrate W. It can be considered that phosphoric acid aqueous solution, which has a viscosity higher than that of water, is less likely to move outward on the substrate W compared to pure water. It is therefore conceivable that a large amount of pure water may move from the central portion of the upper surface of the substrate W to the peripheral portion of the upper surface of the substrate W, resulting in the phosphoric acid aqueous solution having a relatively high concentration in the central portion of the substrate W, while having a relatively low concentration in the peripheral portion of the substrate W.

In fact, the present inventors have confirmed a phenomenon that when the substrate traversing speed is constant and the flow rate of pure water discharged through the pure water discharge port 37 is also constant, increasing the rotation speed of the substrate W to, for example, up to about 10 rpm results in the amount of etching of the silicon nitride film being smaller in the peripheral portion of the upper surface of the substrate W than in the central portion of the upper surface of the substrate W.

This can be for the reason that the above-described mechanism acts on the liquid film on the substrate W. That is, it can be considered that despite the generally uniform thickness of the liquid film on the substrate W in the case where the rotation speed of the substrate W is about 10 rpm, the difference in the amount of etching exists because a large amount of pure water moves to the peripheral portion of the substrate W and, as a result, the concentration of phosphoric acid aqueous solution in the peripheral portion of the substrate W decreases. It is therefore conceivable that when supplying pure water onto the liquid film of phosphoric acid aqueous solution on the substrate W while rotating the substrate W at a relatively high speed (e.g. 10 rpm or higher), setting the amount of pure water supply per unit area larger in the central portion of the upper surface of the substrate W than in the peripheral portion of the upper surface of the substrate W can reduce the variation in the concentration of phosphoric acid aqueous solution in the radial direction of the substrate W and, as a result, can suppress or prevent the variation in the etching rate in the radial direction of the substrate W.

To set the amount of pure water supply per unit area larger in the central portion of the upper surface than in the peripheral portion of the upper surface of the substrate W, it suffices to control at least one of the substrate traversing speed and the flow rate of pure water discharged through the pure water discharge port 37 according to the pure water landing position. For example, the control device 3 controls the heater moving device 33 such that the substrate traversing speed becomes lower in the central portion of the upper surface of the substrate W than in the peripheral portion of the upper surface of the substrate W. Alternatively, it suffices to control the pure water supply device 36 such that the flow rate of pure water discharged through the pure water discharge port 37 becomes higher in the central portion of the upper surface of the substrate W than in the peripheral portion of the upper surface of the substrate W (see FIG. 6).

In the case of rotating the substrate W at a higher speed, it is necessary to further increase the amount of pure water supply per unit area in the central portion of the upper surface of the substrate W. In this case, it suffices that the control device 3 controls as shown in FIG. 7. That is, as the pure water landing position comes close to the central portion of the upper surface of the substrate W from the peripheral portion of the upper surface of the substrate W, the control device 3 may control the heater moving device 33 such that the substrate traversing speed decreases and control the pure water supply device 36 such that the flow rate of pure water discharged through the pure water discharge port 37 increases, which interact to result in the amount of pure water supply per unit area of the substrate W rapidly increasing as the pure water nozzle 38 comes close to the central portion of the substrate W.

On the other hand, as the pure water landing position moves away from the central portion of the upper surface of the substrate W, the control device 3 may control the heater moving device 33 such that the substrate traversing speed increases and control the pure water supply device 36 such that the flow rate of pure water discharged through the pure water discharge port 37 decreases, which interact to result in the amount of pure water supply per unit area of the substrate W rapidly decreasing as the pure water nozzle 38 moves away from the central portion of the substrate W.

Figure 8:
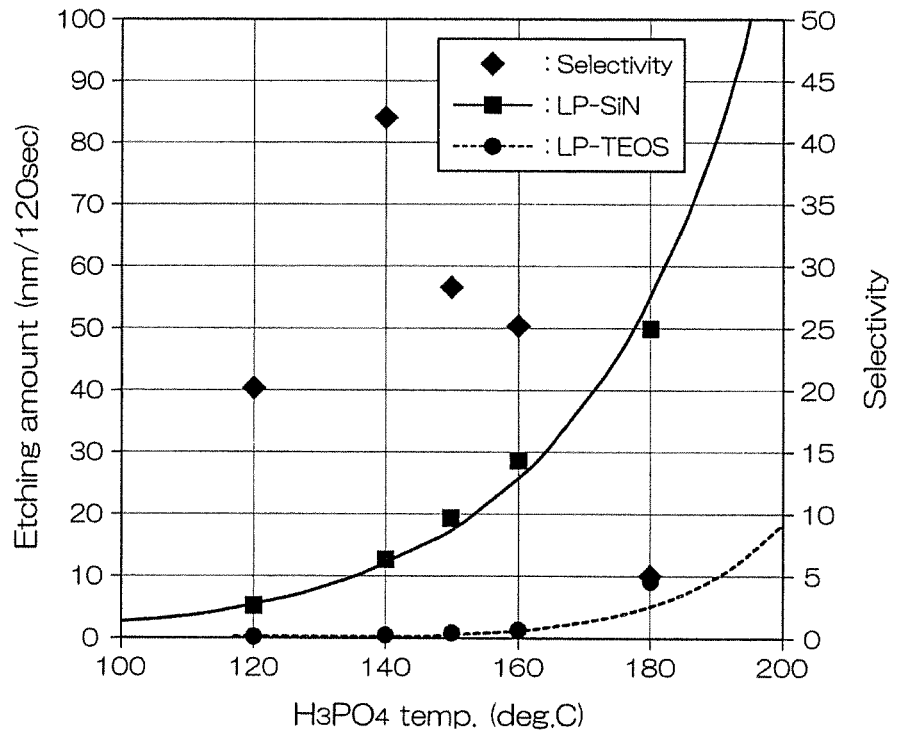
FIG. 8 is a graph showing the relationship between the temperature of phosphoric acid aqueous solution supplied onto the substrate and the etching rate as well as the etching selectivity.

FIG. 8 is a graph showing the relationship between the temperature of phosphoric acid aqueous solution supplied onto the substrate W and the etching rate as well as the etching selectivity.

As shown in FIG. 8, the etching rate of LP-SiN, an example of the silicon nitride film, acceleratedly increases as the temperature of phosphoric acid aqueous solution increases. On the other hand, the etching rate of LP-TEOS, an example of the silicon oxide film, is approximately zero when the temperature of phosphoric acid aqueous solution is in the range of 140° C. or lower. When the temperature of phosphoric acid aqueous solution is within the range from 140° C. to 170° C., the etching rate of LP-TEOS increases gradually as the temperature of phosphoric acid aqueous solution increases and when the temperature of phosphoric acid aqueous solution is in the range of 170° C. or higher, acceleratedly increases as the temperature of phosphoric acid aqueous solution increases. Increasing the temperature of phosphoric acid aqueous solution involves an increase in the etching rate of the silicon nitride film, however, when the temperature of phosphoric acid aqueous solution is in the range of 140° C. or higher, this results in the silicone oxide film also being etched. This leads to a reduction in the etching selectivity. Hence, setting the temperature of phosphoric acid aqueous solution to a predetermined temperature within the range from 120° C. to 160° C. (preferably 140° C.) can increase the etching rate while maintaining a high etching selectivity.

In the first preferred embodiment, a low amount of pure water is supplied onto the liquid film of phosphoric acid aqueous solution. More specifically, the flow rate of pure water supplied onto the substrate W is set by the pure water flow rate control valve 41 to a value at which the phosphoric acid aqueous solution is not removed from the substrate W, that is, the liquid film of phosphoric acid aqueous solution is maintained in a puddle shape on the substrate W. This can prevent the phosphoric acid aqueous solution, which has sufficient activity, from being removed from the substrate W. This allows the phosphoric acid aqueous solution to be used efficiently. Further, since the amount of pure water supplied to the phosphoric acid aqueous solution on the substrate W is small, the changes in the concentration and temperature of the phosphoric acid aqueous solution can be suppressed. It is therefore possible to suppress the fluctuation in the etching rate.

In the first preferred embodiment, pure water is supplied onto the liquid film of phosphoric acid aqueous solution at an amount corresponding to the amount of water evaporated from the liquid film of phosphoric acid aqueous solution. That is, the liquid film of phosphoric acid aqueous solution is replenished with pure water by the evaporated amount. This results in the pyrophosphoric acid in the phosphoric acid aqueous solution decreasing through reaction with the supplied pure water and the change in the concentration of the phosphoric acid aqueous solution associated with the pure water supply being substantially prevented. Further, since the amount of pure water supplied to the phosphoric acid aqueous solution on the substrate W is small, the changes in the concentration and temperature of the phosphoric acid aqueous solution can be suppressed. It is therefore possible to suppress the fluctuation in the etching rate while suppressing the reduction in the etching selectivity.

In the first preferred embodiment, pure water droplets, not in an atomized form, are discharged through the pure water discharge port 37 one by one toward the upper surface of the substrate W. That is, pure water droplets are intermittently discharged through the pure water discharge port 37. Pure water droplets landing on the phosphoric acid aqueous solution on the substrate W move without breaking up in the phosphoric acid aqueous solution toward the interface between the substrate W and the phosphoric acid aqueous solution. Pure water does not diffuse immediately in the phosphoric acid aqueous solution and therefore a relatively large amount of pure water can reach the interface between the substrate W and the phosphoric acid aqueous solution, which in turn causes pyrophosphoric acid existing at the interface between the substrate W and the phosphoric acid aqueous solution to decrease. This can suppress or prevent the reduction in the etching selectivity.

In the first preferred embodiment, the substrate W is irradiated with infrared light emitted from the infrared heater 31 and radiant heat is transferred from the infrared heater 31 to the substrate W. This heats the substrate W and therefore the phosphoric acid aqueous solution on the substrate W. Alternatively, the infrared light directly heats the phosphoric acid aqueous solution. The infrared heater 31 emits infrared light with at least a portion thereof being in contact with the liquid film of phosphoric acid aqueous solution. Accordingly, the infrared heater 31 suppresses water evaporation from the phosphoric acid aqueous solution. This can suppress the change in the concentration of the phosphoric acid aqueous solution. It is further possible to suppress the generation of pyrophosphoric acid in the phosphoric acid aqueous solution and thereby to prevent the etching selectivity from decreasing while stabilizing the etching rate.

In the first preferred embodiment, the heating device 10 heats the phosphoric acid aqueous solution on the substrate W to the boiling point. This can increase the etching rate of the silicon nitride film. While the amount of water evaporation from the phosphoric acid aqueous solution increases, the pure water supply device 36 replenishes the phosphoric acid aqueous solution with pure water at an amount corresponding to the amount of evaporation, whereby the concentration of the phosphoric acid aqueous solution does not significantly change. It is therefore possible to stabilize the etching rate.

In the first preferred embodiment, the substrate W is heated to a temperature equal to or higher than the boiling point of phosphoric acid aqueous solution. The temperature of the upper surface of the substrate W in contact with the phosphoric acid aqueous solution is thus brought up to a temperature equal to or higher than the boiling point of phosphoric acid aqueous solution. It is therefore possible to maintain the phosphoric acid aqueous solution in a boiled state at the interface between the substrate W and the phosphoric acid aqueous solution. This can increase the etching rate.

In the first preferred embodiment, the heater moving device 33 moves the infrared heater 31 and the pure water nozzle 38 while maintaining the positional relationship between the pure water landing position and the position irradiated with infrared light. At this time, the heater moving device 33 moves the infrared heater 31 such that a region adjacent to the pure water landing position is heated by the infrared heater 31. Accordingly, the vicinity of the pure water landing position is heated by the infrared heater 31. It is hence possible to shorten the time required for the substrate W and the phosphoric acid aqueous solution, even if the temperature of which may change with the pure water supply, to return to the original temperature. This can suppress the reduction in the etching uniformity.

In the first preferred embodiment, the heater moving device 33 moves the infrared heater 31 such that a region downstream from the position at which pure water lands on, with respect to the upper surface of the substrate W, with respect to the rotation direction Dr of the substrate W is heated. Accordingly, the pure water landing region (a portion of the substrate W) moves immediately, with the rotation of the substrate W, to the heated region (the region irradiated with infrared light) to be heated by the infrared heater 31. It is hence possible to shorten the time required for the substrate W and the phosphoric acid aqueous solution, even if the temperature of which may decrease temporarily with the pure water supply, to return to the original temperature. This can suppress the reduction in the etching uniformity.

In the first preferred embodiment, the control device 3 changes the speed of the pure water landing position traveling across the substrate W from the peripheral portion to the central portion of the substrate (or the speed traveling across the substrate W from the central portion to the peripheral portion of the substrate, i.e., substrate traversing speed) according to the rotation speed of the substrate W. Specifically, when the rotation speed of the substrate W is lower than a predetermined speed, the control device 3 moves the pure water landing position at a constant substrate traversing speed between the central portion of the upper surface of the substrate W and the peripheral portion of the upper surface of the substrate W. On the other hand, when the rotation speed of the substrate W is equal to or higher than the predetermined speed, the control device 3 reduces the substrate traversing speed of the pure water landing position as the pure water landing position comes close to the central portion of the upper surface of the substrate W from the peripheral portion of the substrate W or increases the substrate traversing speed of the pure water landing position as the pure water landing position moves away from the central portion of the upper surface of the substrate. Accordingly, when the rotation speed of the substrate W is equal to or higher than the predetermined speed, the central portion of the upper surface of the substrate W is supplied with pure water at an amount larger than the peripheral portion of the upper surface of the substrate W.

The present inventors have confirmed a phenomenon that when the rotation speed of the substrate W is high, the amount of etching is larger in the central portion of the upper surface of the substrate W than in the peripheral portion of the upper surface of the substrate W. The difference in the amount of etching can be for the reason that the concentration of phosphoric acid aqueous solution is higher in the central portion of the upper surface of the substrate W than in the peripheral portion of the upper surface of the substrate W. Hence, the control device 3 is arranged to supply pure water onto the central portion of the upper surface of the substrate W at an amount larger than onto the peripheral portion of the upper surface of the substrate W to thereby reduce the concentration of phosphoric acid aqueous solution in the central portion of the upper surface of the substrate W. The control device 3 can thus be arranged to prevent the amount of etching from increasing in the central portion of the upper surface of the substrate W. This can increase the in-plane etching uniformity.

Second Preferred Embodiment

Next will be described a second preferred embodiment of the present invention. The second preferred embodiment differs from the first preferred embodiment primarily in that the processing unit 2 further includes a humidifying device 242. In the following description of FIGS. 9 and 10, components identical to those shown in FIGS. 1 to 8 described above are designated by the same reference symbols as in FIG. 1 and other drawings are omitted from the description thereof.

Figure 9:
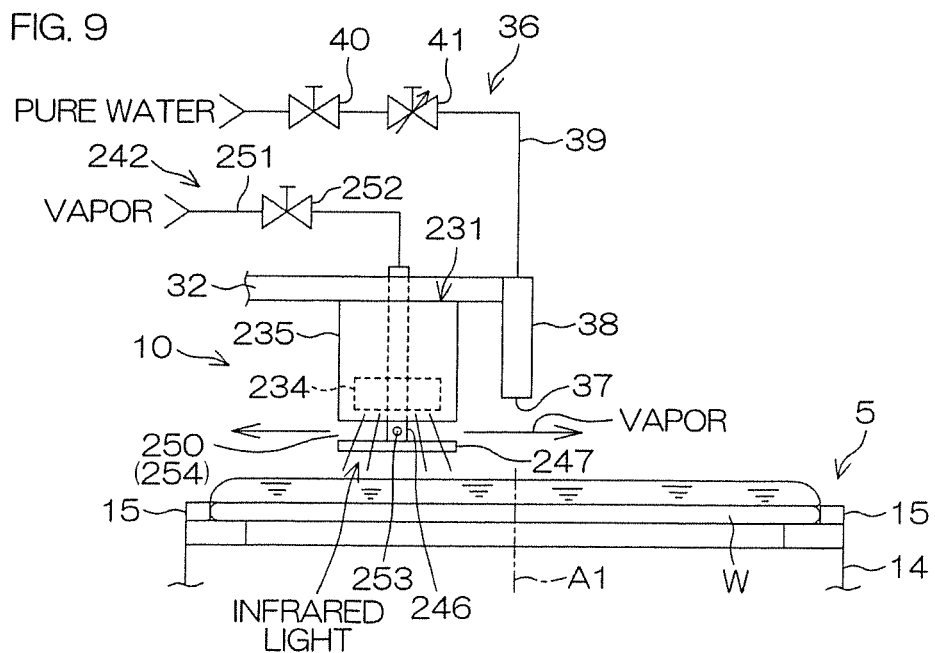
FIG. 9 is a horizontal schematic view showing an infrared heater and a spin chuck according to a second preferred embodiment of the present invention.
Figure 10:
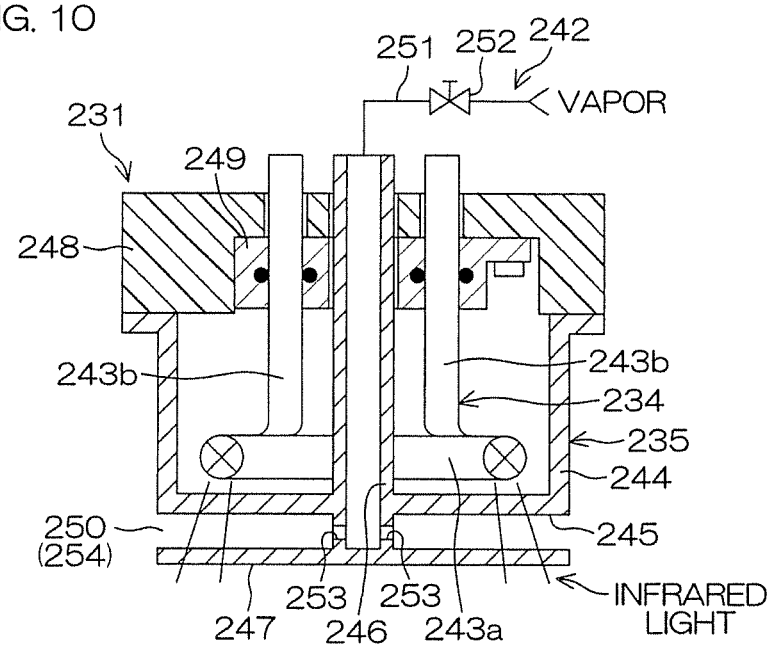
FIG. 10 is a vertical cross-sectional view of the infrared heater according to the second preferred embodiment of the present invention.

FIG. 9 is a horizontal schematic view showing an infrared heater 231 and the spin chuck 5 according to the second preferred embodiment of the present invention. FIG. 10 is a vertical cross-sectional view of the infrared heater 231 according to the second preferred embodiment of the present invention.

The processing unit 2 according to the second preferred embodiment further includes the humidifying device 242 for discharging humidifying gas with a humidity higher than that within the chamber 4 over the substrate W. The humidifying device 242 includes a humidifying nozzle 250 for discharging humidifying gas therethrough over the substrate W. The humidifying nozzle 250 may be provided integrally with or separately from the infrared heater 31. FIGS. 9 and 10 show an example in which the humidifying nozzle 250 is provided integrally with the infrared heater 31.

The heating device 10 includes the infrared heater 231, in place of the infrared heater 31 according to the first preferred embodiment. The infrared heater 231 includes an infrared lamp 234 for emitting infrared light and a lamp housing 235 housing the infrared lamp 234 therein. The infrared lamp 234 is disposed within the lamp housing 235. The lamp housing 235 is smaller than the substrate W in a plan view. Accordingly, the infrared lamp 234 disposed within the lamp housing 235 is also smaller than the substrate W in a plan view. The infrared lamp 234 and the lamp housing 235 are attached to the heater arm 32. Accordingly, the infrared lamp 234 and the lamp housing 235 swing together with the heater arm 32 about the swing axis A3 (see FIG. 1).

The infrared lamp 234 includes a filament and a quartz tube housing the filament therein. As shown in FIG. 10, the infrared lamp 234 includes an ended annular portion 243a disposed along a horizontal plane and a pair of vertical portions 243b extending upward from one and the other end portions of the annular portion 243a. The infrared lamp 234 (e.g. halogen lamp) may be a carbon heater or another type of heating element. At least a portion of the lamp housing 235 is made of a material having optical transparency and heat resistance, such as quartz.

When the infrared lamp 234 emits light, light containing infrared light is emitted from the infrared lamp 234. The light containing infrared light transmits through the lamp housing 235 to be emitted from the outer surface of the lamp housing 235 or heats the lamp housing 235 to emit radiant light from the outer surface of the lamp housing 235. The substrate W and a liquid film of phosphoric acid aqueous solution held on the upper surface of the substrate W are heated by the transmitted light and radiant light from the outer surface of the lamp housing 235. Although transmitted or radiant light containing infrared light is thus emitted from the outer surface of the lamp housing 235, the infrared lamp 234 will hereinafter be described focusing on infrared light transmitting through the outer surface of the lamp housing 235.

The lamp housing 235 includes a transmissive member through which infrared light can transmit. As shown in FIG. 10, the transmissive member includes a vertically extending cylindrical housing portion 244, a disk-like bottom plate portion 245 closing the lower end of the housing portion 244, a central tube 246 vertically extending along the center line of the housing portion 244 and protruding downward from the lower surface of the bottom plate portion 245 and a disk-like opposing plate 247 disposed below the bottom plate portion 245 and supported on the lower end of the central tube 246. The lamp housing 235 further includes a lid member 248 closing the upper end of the housing portion 244 and a support member 249 supporting the pair of vertical portions 243b of the infrared lamp 234. The infrared lamp 234 is supported on the lid member 248 via the support member 249.

As shown in FIG. 10, the annular portion 243a of the infrared lamp 234 is disposed in a cylindrical space defined by the housing portion 244, the bottom plate portion 245 and the central tube 246. The annular portion 243a of the infrared lamp 234 surrounds the central tube 246 inside the housing portion 244. The bottom plate portion 245 is disposed below the infrared lamp 234 and vertically opposed to the infrared lamp 234 with a space therebetween. Similarly, the opposing plate 247 is disposed below the bottom plate portion 245 and vertically opposed to the bottom plate portion 245 with a space therebetween. The bottom plate portion 245 and the opposing plate 247 have the same outside diameter with respect to each other. The lower surface of the bottom plate portion 245 and the upper surface of the opposing plate 247 are vertically opposed parallel to each other with a space therebetween.

Infrared light from the infrared lamp 234 transmits downward through the bottom plate portion 245 and the opposing plate 247, which are made of quartz, to be emitted downward from the lower surface of the opposing plate 247. The lower surface of the opposing plate 247 includes a flat irradiation surface parallel to the upper surface of the substrate W. When the infrared heater 231 is disposed over the substrate W, the irradiation surface of the lamp housing 235 is vertically opposed to the upper surface of the substrate W with a space therebetween. In this state, infrared light, when emitted from the infrared lamp 234, transmits through the lamp housing 235 and then travels from the irradiation surface of the lamp housing 235 toward the upper surface of the substrate W to be irradiated onto the upper surface of the substrate W. This allows radiant heat transferred from the infrared lamp 234 to the substrate W to heat the substrate W.

As shown in FIG. 10, the humidifying device 242 includes the humidifying nozzle 250 constituted by the bottom plate portion 245 and the opposing plate 247, a humidifying gas pipe 251 for supplying humidifying gas therethrough to the central tube 246 and a humidifying gas valve 252 for switching between start and stop of the supply of humidifying gas from the humidifying gas pipe 251 to the central tube 246. The lower end of the central tube 246 is closed by the opposing plate 247. The central tube 246 includes multiple (e.g. eight) through holes 253 disposed at heights between the lower surface of the bottom plate portion 245 and the upper surface of the opposing plate 247. The multiple through holes 253 extend from the inner peripheral surface to the outer peripheral surface of the central tube 246 to be opened in the outer peripheral surface of the central tube 246. The multiple through holes 253 are disposed circumferentially with a space therebetween. The humidifying nozzle 250 includes an annular discharge port 254 constituted by the outer peripheral portion of the bottom plate portion 245 and the outer peripheral portion of the opposing plate 247. The annular discharge port 254 continues in the entire circumferential direction and is disposed around the multiple through holes 253.

When the humidifying gas valve 252 is opened, humidifying gas supplied through the humidifying gas pipe 251 to the central tube 246 is discharged through the multiple through holes 253 to around the central tube 246 to flow outward in the radial direction of the substrate W between the lower surface of the bottom plate portion 245 and the upper surface of the opposing plate 247. After reaching the outer peripheral portions of the bottom plate portion 245 and the opposing plate 247, the humidifying gas is then horizontally discharged through the annular discharge port 254. This causes an airflow of the humidifying gas radially spreading from the annular discharge port 254 to be formed. The humidifying gas is vapor of lower than 100° C. The humidifying gas is not limited to vapor, but may be a mist of pure water (atomized pure water of the room temperature) or superheated vapor of 100° C. or higher.

In processing of the substrate W by the processing unit 2, the control device 3 (see FIG. 1) performs a humidifying step to discharge vapor, an example of humidifying gas, within the chamber 4 in parallel to the radiant heating step, the pure water supply step and the puddle step described above. Specifically, the control device 3 opens the humidifying gas valve 252, before moving the infrared heater 231 and the pure water nozzle 38 over the substrate W, to start discharging vapor through the humidifying nozzle 250. This increases the humidity within the chamber 4 and the vapor pressure approaches the saturation vapor pressure. Since the discharge of vapor through the humidifying nozzle 250 continues even after the control device 3 moves the infrared heater 231 and the pure water nozzle 38 over the substrate, the atmosphere over the substrate W can approach the saturation vapor pressure. It is noted that the discharge of vapor through the humidifying nozzle 250 may be started after the infrared heater 231 starts emitting infrared light, although performed from before the infrared heater 231 starts emitting infrared light in this preferred embodiment.

After the infrared heater 231 and the pure water nozzle 38 are disposed over the substrate W, the control device 3 controls the heater moving device 33 to move the infrared heater 231 and the pure water nozzle 38 horizontally such that the position with respect to the upper surface of the substrate W irradiated with infrared light moves from one to the other of the central portion and the peripheral portion. At this time, the control device 3 may move the infrared heater 231 with the lower surface of the opposing plate 247 being in contact with the liquid film of phosphoric acid aqueous solution on the substrate W or with the lower surface of the infrared heater 231 being separated by a predetermined distance from the liquid film of phosphoric acid aqueous solution on the substrate W.

The control device 3 opens and closes the pure water valve 40 multiple times while the position irradiated with infrared light moves between the central portion of the upper surface of the substrate W and the peripheral portion of the upper surface of the substrate W. This causes the pure water landing position to move between the central portion of the upper surface of the substrate W and the peripheral portion of the upper surface of the substrate W and pure water to be intermittently discharged, preferably several pure water droplets to be discharged one by one through the pure water discharge port 37 of the pure water nozzle 38. With the removal of phosphoric acid aqueous solution from the substrate W being stopped, the multiple pure water droplets are thus supplied to multiple positions within the upper surface of the substrate W. After the substrate W is heated by the infrared heater 231 over a predetermined period of time, the control device 3 stops the discharge of droplets through the pure water nozzle 38 and retracts the infrared heater 231 and the pure water nozzle 38 from over the substrate W.

Thereafter, the control device 3 controls the infrared heater 231 to stop light emitting and controls the humidifying nozzle 250 to stop vapor discharging. The discharge of vapor through the humidifying nozzle 250 may be stopped before or after the infrared heater 231 stops emitting infrared light.

Since with the phosphoric acid aqueous solution on the substrate W being heated, the control device 3 thus makes the humidifying nozzle 250 discharge humidifying gas with a humidity higher than that within the chamber 4, the humidity within the chamber 4 increases. This reduces the amount of water evaporation from the phosphoric acid aqueous solution. Particularly in the second preferred embodiment, since the humidifying gas is radially discharged through the annular discharge port 254 and an airflow of the humidifying gas flowing along the upper surface of the substrate W is formed, the entire upper surface of the liquid film is covered with the airflow of the humidifying gas. As a result, compared to the case where humidifying gas is discharged at a position away from the substrate W, the humidity in the vicinity of the substrate W can be reliably increased and thereby the water evaporation from the phosphoric acid aqueous solution can be suppressed efficiently. It is therefore possible to efficiently suppress the generation of pyrophosphoric acid and suppress the reduction in the etching selectivity.

In the above-described second preferred embodiment, humidifying gas with a humidity higher than that within the chamber 4 is supplied into the chamber 4. This results in an increase in the humidity within the chamber 4 and therefore an increase in the vapor pressure within the chamber 4 to a value equal to or lower than the saturation vapor pressure. This suppresses water evaporation from the phosphoric acid aqueous solution on the substrate W. It is therefore possible to efficiently suppress the generation of pyrophosphoric acid in the phosphoric acid aqueous solution and suppress the reduction in the etching selectivity.

In the second preferred embodiment, humidifying gas with a humidity higher than that within the chamber 4 and a temperature higher than the ambient temperature (room temperature) within the chamber 4 is supplied into the chamber 4. This results in an increase in the humidity and ambient temperature within the chamber 4. It is therefore possible to suppress the reduction in the etching rate.

In the second preferred embodiment, the humidifying gas is radially discharged through the annular discharge port 254 in a direction parallel to the upper surface of the substrate W. This causes an airflow of the humidifying gas radially spreading from the annular discharge port 254 to be formed over the liquid film of phosphoric acid aqueous solution and thus the liquid film of phosphoric acid aqueous solution to be covered with the airflow of the humidifying gas. This reliably increases the humidity over the liquid film of phosphoric acid aqueous solution. This suppresses water evaporation from the phosphoric acid aqueous solution on the substrate W. It is therefore possible to suppress the generation of pyrophosphoric acid in the phosphoric acid aqueous solution and suppress the reduction in the etching selectivity.

Third Preferred Embodiment

Next will be described a third preferred embodiment of the present invention. The third preferred embodiment differs from the first preferred embodiment primarily in that the heating device 10 includes a heating fluid supply device for supplying heating fluid onto the lower surface of the substrate W to heat the substrate W, in addition to the radiant heating device according to the first preferred embodiment. In the following description of FIG. 11, components identical to those shown in FIGS. 1 to 10 described above are designated by the same reference symbols as in FIG. 1 and other drawings are omitted from the description thereof.

Figure 11:
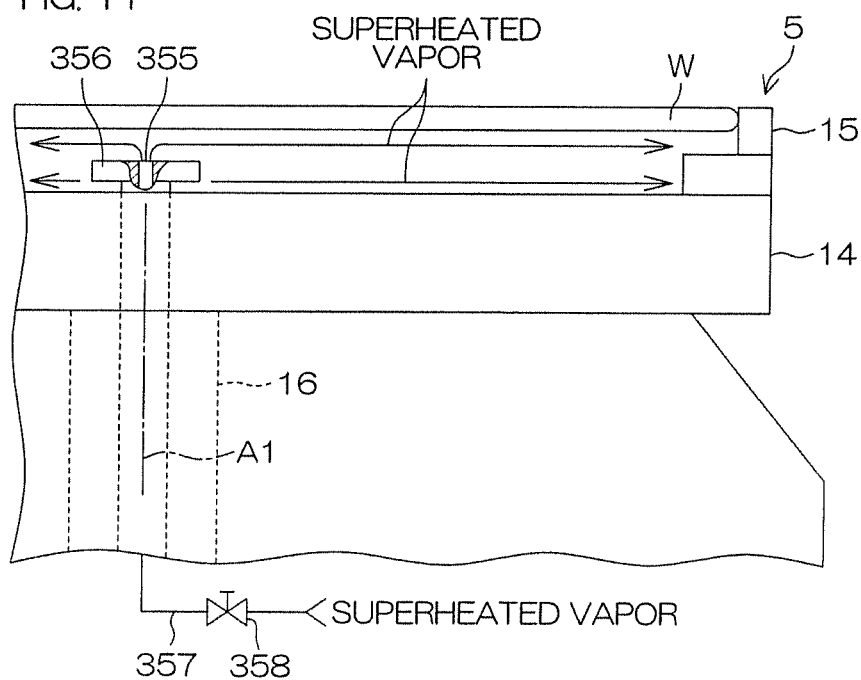
FIG. 11 is a horizontal schematic view showing a heating nozzle and a spin chuck according to a third preferred embodiment of the present invention.

FIG. 11 is a horizontal schematic view showing a fluid nozzle 356 and the spin chuck 5 according to the third preferred embodiment of the present invention.

The heating device 10 according to the third preferred embodiment further includes a heating fluid supply device for discharging heating fluid onto the substrate W to heat the substrate W and increase the humidity within the chamber 4. The heating fluid supply device includes the fluid nozzle 356 for discharging heating fluid with a temperature higher than that of the substrate W through a fluid discharge port 355 toward the lower surface of the substrate W, a fluid pipe 357 for supplying heating fluid therethrough to the fluid nozzle 356 and a fluid valve 358 for switching between start and stop of the supply of heating fluid from the fluid pipe 357 to the fluid nozzle 356. The fluid nozzle 356 includes the fluid discharge port 355 for discharging heating fluid therethrough upward.

The fluid discharge port 355 of the fluid nozzle 356 is disposed between the lower surface of the substrate W and the upper surface of the spin base 14. The fluid discharge port 355 of the fluid nozzle 356 is vertically opposed to a central portion of the lower surface of the substrate W with a space therebetween. The heating fluid is superheated vapor. The heating fluid is not limited to superheated vapor, but may be high-temperature pure water (with a temperature higher than that of the substrate W) or high-temperature gas (inert gas or clean air with a temperature higher than that of the substrate W). That is, the heating fluid may be liquid (heating liquid) or gaseous (heating gas).

When the fluid valve 358 is opened, heating fluid is discharged through the fluid discharge port 355 of the fluid nozzle 356 toward the central portion of the lower surface of the substrate W. If the heating fluid is heating liquid, the heating liquid, when discharged through the fluid discharge port 355 of the fluid nozzle 356 with the substrate W rotating, collides with the central portion of the lower surface of the substrate W and then, due to a centrifugal force, radially diffuses along the lower surface of the substrate W from the central portion of the lower surface of the substrate W to a peripheral portion of the lower surface of the substrate W. If the heating fluid is heating gas, the heating fluid, when discharged through the fluid nozzle 356, collides with the central portion of the lower surface of the substrate W and then radially diffuses between the lower surface of the substrate W and the upper surface of the spin base 14, that is, in the space between the substrate W and the spin base 14. The heating fluid, if may be either heating liquid or heating gas, is thus supplied onto the entire lower surface of the substrate W, so that the substrate W is heated entirely and uniformly.

In processing of the substrate W by the processing unit 2, the control device 3 (see FIG. 1) starts a heating fluid supply step to discharge superheated vapor, an example of heating fluid, toward the lower surface of the substrate W before starting the above-described phosphoric acid supply step. Specifically, the control device 3 opens the fluid valve 358 so that superheated vapor is discharged through the fluid nozzle 356 toward the central portion of the lower surface of the substrate W. The discharge of superheated vapor may be started with the substrate W rotating or not rotating.

The superheated vapor discharged through the fluid nozzle 356 collides with the central portion of the lower surface of the substrate W and then radially diffuses between the lower surface of the substrate W and the upper surface of the spin base 14, that is, in the space between the substrate W and the spin base 14. The superheated vapor then comes into contact with the entire lower surface and the circumferential end surface of the substrate W, so that heat of the superheated vapor is transferred to the entire lower surface of the substrate W. This heats the substrate W uniformly.

With the fluid nozzle 356 discharging superheated vapor therethrough, the control device 3 performs the above-described phosphoric acid supply step. Similarly, with the fluid nozzle 356 discharging superheated vapor therethrough, the control device 3 performs the radiant heating step, the pure water supply step and the puddle step described above. After retracting the infrared heater 31 and the pure water nozzle 38 from over the substrate W, the control device 3 then closes the fluid valve 358 to stop superheated vapor discharging through the fluid nozzle 356. The discharge of superheated vapor through the fluid nozzle 356 may be stopped before or after the infrared heater 31 stops emitting infrared light.

In the above-described third preferred embodiment, the upper surface of the substrate W is irradiated with infrared light emitted from the infrared heater 31, so that the substrate W is heated. Further, heating fluid discharged through the fluid nozzle 356 is supplied onto the entire lower surface of the substrate W, so that the substrate W is heated in its entirety. The heating fluid with a temperature higher than that of the substrate W is thus supplied onto the entire lower surface of the substrate W, which can increase the processing temperature uniformity over the entire substrate W. It is therefore possible to increase the temperature uniformity of the liquid film of phosphoric acid aqueous solution and therefore the etching uniformity.

Particularly in the case where superheated vapor of 100° C. or higher, serving as heating fluid and heating gas, is discharged through the fluid nozzle 356 serving as a heating device and supplied onto the entire lower surface of the substrate W, the substrate W and the liquid film of phosphoric acid aqueous solution on the substrate W can be heated efficiently. Further, the superheated vapor on the lower surface of the substrate W can flow around through the circumferential end surface of the substrate W onto the upper surface of the substrate W or diffuse around the spin chuck 5 holding the substrate W thereon to humidify the interior of the chamber 4. This suppresses water evaporation from the phosphoric acid aqueous solution on the substrate W. It is therefore possible to reduce pyrophosphoric acid in the phosphoric acid aqueous solution and suppress the reduction in the etching selectivity.

Fourth Preferred Embodiment

Next will be described a fourth preferred embodiment of the present invention. The fourth preferred embodiment differs from the first preferred embodiment primarily in that the pure water discharge port 37 for discharging pure water therethrough is provided in a central portion of the lower surface of an infrared heater 431. In the following description of FIG. 12, components identical to those shown in FIGS. 1 to 11 described above are designated by the same reference symbols as in FIG. 1 and other drawings are omitted from the description thereof.

Figure 12:
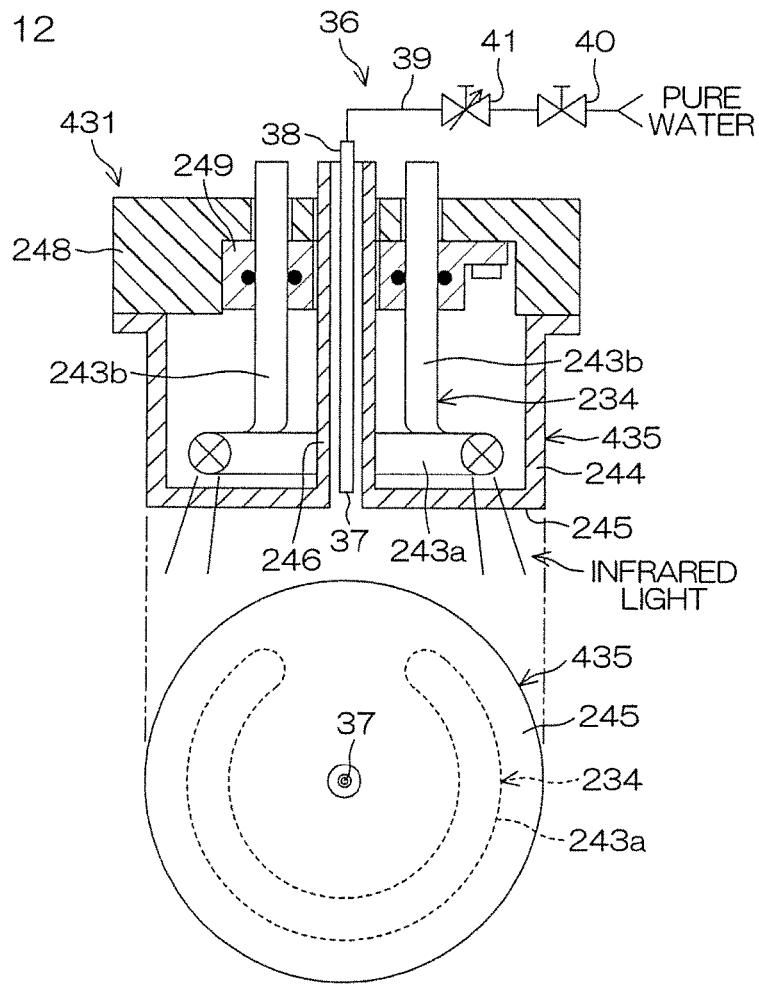
FIG. 12 is a schematic view showing the vertical cross-section and the bottom surface of an infrared heater and a pure water nozzle according to a fourth preferred embodiment of the present invention.

FIG. 12 is a schematic view showing the vertical cross-section and the bottom surface of the infrared heater 431 and the pure water nozzle 38 according to the fourth preferred embodiment of the present invention.

The heating device 10 according to the fourth preferred embodiment includes the infrared heater 431, in place of the infrared heater 31 according to the first preferred embodiment. The infrared heater 431 includes the infrared lamp 234 for emitting infrared light and a lamp housing 435 housing the infrared lamp 234 therein. The infrared lamp 234 is disposed within the lamp housing 435. The lamp housing 435 is smaller than the substrate W in a plan view. Accordingly, the infrared lamp 234 disposed within the lamp housing 935 is also smaller than the substrate W in a plan view. The infrared lamp 234 and the lamp housing 935 are attached to the heater arm 32 (see FIG. 1). Accordingly, the infrared lamp 234 and the lamp housing 435 swing together with the heater arm 32 about the swing axis A3 (see FIG. 1). It is noted that in the heating and pure water supply step S9 in the first preferred embodiment, the heater arm 32 is swung such that the pure water landing position moves only between the central portion of the upper surface of the substrate W and one peripheral position of the upper surface of the substrate W (the range indicated by the arrow in FIG. 3). However, in the fourth preferred embodiment, the swing range of the heater arm 32 in the heating and pure water supply step S4 is expanded such that the pure water landing position moves between two peripheral positions of the substrate W.

The infrared lamp 234 includes a filament and a quartz tube housing the filament therein. The infrared lamp 234 further includes the ended annular portion 243a disposed along a horizontal plane and the pair of vertical portions 243b extending upward from one and the other end portions of the annular portion 243a. The infrared lamp 234 serving as a heating device (e.g. halogen lamp) may be a carbon heater or another type of heating element. At least a portion of the lamp housing 435 is made of a material having optical transparency and heat resistance, such as quartz.

When the infrared lamp 234 emits light, light containing infrared light is emitted from the infrared lamp 234. The light containing infrared light transmits through the lamp housing 935 to be emitted from the outer surface of the lamp housing 935 or heats the lamp housing 435 to emit radiant light from the outer surface of the lamp housing 935. The substrate W and a liquid film of phosphoric acid aqueous solution held on the upper surface of the substrate W are heated by the transmitted light and radiant light from the outer surface of the lamp housing 435. Although transmitted or radiant light containing infrared light is thus emitted from the outer surface of the lamp housing 435, the infrared lamp 234 will hereinafter be described focusing on infrared light transmitting through the outer surface of the lamp housing 935.

The lamp housing 435 includes a transmissive member through which infrared light can transmit. The transmissive member includes the vertically extending cylindrical housing portion 244, the disk-like bottom plate portion 245 closing the lower end of the housing portion 244 and the central tube 246 vertically extending along the center line of the housing portion 244 and opened in a central portion of the lower surface of the bottom plate portion 295. The lamp housing 435 further includes the lid member 298 closing the upper end of the housing portion 244 and the support member 249 supporting the pair of vertical portions 243b of the infrared lamp 234. The infrared lamp 234 is supported on the lid member 248 via the support member 249.

The annular portion 243a of the infrared lamp 234 is disposed in a cylindrical space defined by the housing portion 244, the bottom plate portion 245 and the central tube 246. The annular portion 243a of the infrared lamp 234 surrounds the central tube 246 inside the housing portion 244. The bottom plate portion 245 is disposed below the infrared lamp 234 and vertically opposed to the infrared lamp 234 with a space therebetween. The pure water nozzle 38 is inserted into the central tube 246. The pure water discharge port 37 of the pure water nozzle 38 is disposed inside the central tube 246. As shown in the lower part of FIG. 12, the pure water discharge port 37 is surrounded by the lower surface of the bottom plate portion 245 serving as an irradiation surface when the infrared heater 431 is viewed from below. Accordingly, pure water droplets discharged through the pure water nozzle 38 are discharged through the lower surface of the bottom plate portion 245.

In accordance with the arrangement above, since pure water droplets are discharged through the irradiation surface of the infrared heater 431, the pure water landing position is included in the position irradiated with infrared light. That is, when the pure water discharge port 37 discharges pure water droplets therethrough with the substrate W rotating and the infrared heater 431 emitting infrared light, the region on which the pure water droplets land, regardless of its position within the upper surface of the substrate W, moves immediately to the irradiated position to be heated. Accordingly, even if the infrared heater 431 and the pure water nozzle 38 may move between two positions at which pure water droplets land on the peripheral portion of the upper surface of the substrate W, the region on which the pure water droplets land is heated immediately. This can suppress the fluctuation in the temperature of the substrate W.

Fifth Preferred Embodiment

Next will be described a fifth preferred embodiment of the present invention. The fifth preferred embodiment differs from the first preferred embodiment primarily in that the pure water supply device 36 further includes a pure water temperature control device 559 for controlling the temperature of pure water discharged through the pure water nozzle 38. In the following description of FIG. 13, components identical to those shown in FIGS. 1 to 12 described above are designated by the same reference symbols as in FIG. 1 and other drawings are omitted from the description thereof.

Figure 13:
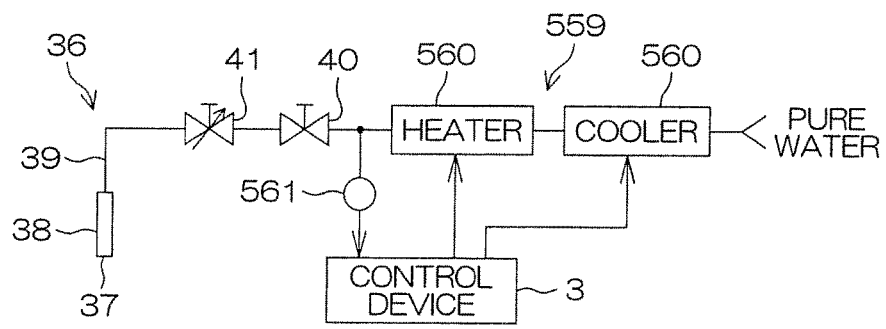
FIG. 13 is a schematic view of a pure water supply device according to a fifth preferred embodiment of the present invention.

FIG. 13 is a schematic view of the pure water supply device 36 according to the fifth preferred embodiment of the present invention.

The pure water supply device 36 includes the pure water nozzle 38, the pure water pipe 39, the pure water valve 40 and the pure water flow rate control valve 41, and additionally the pure water temperature control device 559 for controlling the temperature of pure water supplied through the pure water pipe 39 to the pure water nozzle 38. The pure water temperature control device 559 includes a temperature controller 560 (at least one of a heater and a cooler) for controlling the temperature of pure water flowing within the pure water pipe 39. FIG. 13 shows an example in which both a heater and a cooler are provided in the pure water temperature control device 559. The pure water temperature control device 559 may further include a temperature sensor 561 for detecting the temperature of pure water the temperature of which is controlled by the temperature controller 560.

In accordance with the arrangement above, pure water droplets, the temperature of which is controlled by the pure water temperature control device 559, are supplied onto the substrate W in the above-described pure water supply step. The pure water, if having an excessively high temperature, may be evaporated before reaching the interface between the substrate W and the phosphoric acid aqueous solution. On the other hand, if the pure water has an excessively low temperature, the temperature of the phosphoric acid aqueous solution on the substrate W may significantly change. Hence, pure water droplets, the temperature of which is controlled by the pure water temperature control device 559, are discharged through the pure water nozzle 38 to allow the pure water to reach the interface between the substrate W and the phosphoric acid aqueous solution while suppressing the fluctuation in the temperature of the phosphoric acid aqueous solution on the substrate W. If the temperature sensor 561 is provided in the pure water temperature control device 559, the control device 3 can control the temperature set by the temperature controller 560 based on a value detected by the temperature sensor 561. The control device 3 can therefore control the temperature of pure water to be supplied onto the substrate W more precisely.

Other Preferred Embodiments

Although the first to fifth preferred embodiments of the present invention have been described heretofore, the present invention is not limited to the description of the above-described first to fifth preferred embodiments and various modifications may be made within the scope of the appended claims.

For example, the first to fifth preferred embodiments describe the case where the infrared heater 31 including the infrared lamp 34 is used as a heater. However, another type of heating element such as a heating wire may be used as a heating device for heating the substrate W to substitute for the infrared lamp 34.

The first to fifth preferred embodiments describe the case where the spin chuck 5 for horizontally holding and rotating the substrate W thereon is used as a substrate holding device. However, the processing unit 2 may include a substrate holding device for horizontally holding the substrate W thereon in a still state to substitute for the spin chuck 5.

Although the first to fifth preferred embodiments describe the case where the infrared heater 31 and the pure water nozzle 38 are attached to the common movable arm (heater arm 32), the infrared heater 31 and the pure water nozzle 38 may be attached to different movable arms. That is, the pure water supply device 36 may include a nozzle arm with a pure water nozzle attached to the tip portion thereof (movable arm different from the heater arm 32) and a pure water nozzle moving device for moving the nozzle arm to move the pure water nozzle. In this case, the positional relationship between the position irradiated with infrared light and pure water landing position may not be constant. The phosphoric acid nozzle 18, the infrared heater 31 and the pure water nozzle 38 may also be attached to a common movable arm (e.g. heater arm 32). It is noted that in the fourth preferred embodiment, since the pure water nozzle 38 is disposed inside the infrared heater 431, the pure water nozzle 38 and the infrared heater 431 are attached to the same movable arm (heater arm 32).

Although the first, second, third and fifth preferred embodiments describe the case where the control device 3 swings the infrared heater 31 and the pure water nozzle 38 between the center position where the pure water landing position is in the central portion of the upper surface of the substrate W and the edge position where the pure water landing position is in the peripheral portion of the upper surface of the substrate W, the control device 3 may move the infrared heater 31 and the pure water nozzle 38 between two edge positions at which pure water droplets discharged through the pure water nozzle 38 land on the peripheral portion of the upper surface of the substrate W.

Although the first, second, third and fifth preferred embodiments describe the case where the pure water nozzle 38 is attached to the heater arm 32 closer to the tip of the heater arm 32 than the infrared heater 31, the pure water nozzle 38 may be attached to the heater arm 32 closer to the base of the heater arm 32 than the infrared heater 31. Alternatively, the infrared heater 31 and the pure water nozzle 38 may be disposed at the same distance from the swing axis A3 in a plan view and laid side-by-side in the swing direction of the heater arm 32.

The first to fifth preferred embodiments describe the case where the pure water valve 40 is opened and closed to form pure water droplets. However, the pure water nozzle 38 may include a piezo element for vibrating and thereby splitting pure water discharged through the pure water discharge port 37 with the pure water valve 40 being opened.

Although the first to fifth preferred embodiments describe the case where the rotation speed of the substrate W is maintained constant during the pure water supply step, the rotation speed of the substrate W may be changed during the pure water supply step.

Specifically, a low-speed rotation step to rotate the substrate W at a rotation speed (e.g. 1 to 30 rpm) lower than the rotation speed of the substrate W during the phosphoric acid supply step and a high-speed rotation step to rotate the substrate W at a rotation speed (e.g. 50 rpm) higher than the low rotation speed may be performed in parallel to the pure water supply step. In this case, a large centrifugal force acts on pure water droplets supplied onto the substrate W during the high-speed rotation step, whereby pure water can diffuse to a wider range within the upper surface of the substrate W in a short time.

The first to fifth preferred embodiments describe the case where the infrared heater 31 starts heating the substrate W after phosphoric acid aqueous solution is supplied onto the substrate W. However, the infrared heater 31 may start heating the substrate W before phosphoric acid aqueous solution is supplied onto the substrate W. In this case, phosphoric acid aqueous solution is supplied onto the substrate W with the substrate W being heated, which can shorten the time required to bring the temperature of the phosphoric acid aqueous solution up to a predetermined temperature.

Although the first to fifth preferred embodiments describe the case where the infrared heater 31 heats the substrate W and the pure water nozzle 38 supplies pure water therethrough with the supply of phosphoric acid aqueous solution onto the substrate W being stopped, the infrared heater 31 may heat the substrate W and the pure water nozzle 38 may supply pure water therethrough with the phosphoric acid nozzle 18 discharging phosphoric acid aqueous solution therethrough. That is, the radiant heating step and the pure water supply step may be performed in parallel to the phosphoric acid supply step. In this case, the puddle step may be omitted.

Although the third preferred embodiment describes the case where the fluid nozzle 356 is provided to discharge heating fluid therethrough toward the substrate W, the fluid nozzle 356 may not be provided if a hot plate with a heating element incorporated therein is used to substitute for the spin base 14. In this case, since the substrate W is horizontally held on the hot plate with the entire lower surface of the substrate W being in contact with the upper surface of the hot plate, heat constantly emitted from the hot plate is uniformly transferred to the entire substrate W. This allows the substrate W to be uniformly heated.

Although the first to fifth preferred embodiments describe the case where the substrate processing apparatus 1 is arranged to process a disk-like substrate W, the substrate processing apparatus 1 may be arranged to process a polygonal substrate W such as a liquid crystal display device substrate.

The preferred embodiments of the present invention, which have heretofore been described in detail, are merely specific examples used to clarify the technical details of the present invention. The present invention should not be understood to be limited to these specific examples. The spirit and scope of the present invention is limited only by the terms of the appended claims.

This application corresponds to Japanese Patent Application No. 2013-28125 filed with the Japan Patent Office on Feb. 15, 2013, the disclosure of which is incorporated by reference herein in its entirety.

What is claimed is:

1. A substrate processing method comprising:
   a puddle step of holding a liquid film of a phosphoric acid aqueous solution on a substrate and etching a silicon nitride film formed on the substrate;
   a liquid film heating step of, in parallel to the puddle step, causing a heater disposed above the substrate to heat the liquid film of the phosphoric acid aqueous solution on the substrate at a temperature not less than a boiling point of the phosphoric acid aqueous solution at a current concentration of the phosphoric acid aqueous solution;
   a pure water supplying step of, in parallel to the puddle step, supplying a pure water to the liquid film of the phosphoric acid aqueous solution on the substrate while maintaining a state in which the liquid film is boiling; and
   a rinse liquid supply step of rinsing off the phosphoric acid aqueous solution on the substrate by supplying a rinse liquid to the substrate after the supply of the pure water to the liquid film of the phosphoric acid aqueous solution on the substrate is stopped in the pure water supplying step.

2. The substrate processing method according to claim 1, wherein the pure water supplying step supplies the pure water to the liquid film of the phosphoric acid aqueous solution on the substrate at an amount corresponding to an amount of water evaporated from the liquid film of phosphoric acid aqueous solution due to heating in the liquid film heating step.

3. The substrate processing method according to claim 1, wherein the puddle step holds the liquid film of the phosphoric acid aqueous solution on the substrate and selectively etches the silicon nitride film formed on the substrate while minimizing an etching amount of a silicon oxide film formed on the substrate.

4. The substrate processing method according to claim 1, wherein the pure water supplying step discharges droplets of the pure water one by one toward the liquid film of the phosphoric acid aqueous solution on the substrate.

5. The substrate processing method according to claim 1, wherein the liquid film heating step includes
   a heating step of, in parallel to the puddle step, partially heating the liquid film of the phosphoric acid aqueous solution on the substrate at the temperature, and
   a heated position changing step of, in parallel to the heating step, moving a heated position of the liquid film which is heated in the heating step along the liquid film.

6. The substrate processing method according to claim 5, further comprising a substrate rotating step of rotating the substrate in a rotation direction, wherein the heated position changing step moves the heated position along the liquid film such that the heated position is disposed downstream of a landing position, on which the pure water lands in the pure water supplying step, with respect to the rotation direction.

7. The substrate processing method according to claim 1, wherein the pure water supplying step includes a supplying step of, in parallel to the puddle step, supplying the pure water to the liquid film of the phosphoric acid aqueous solution on the substrate while maintaining a state in which the liquid film is boiling, and a landing position changing step of, in parallel to the supplying step, moving a landing position, on which the pure water lands, along the substrate.

8. The substrate processing method according to claim 7, further comprising a substrate rotating step of rotating the substrate in a rotation direction, wherein the landing position changing step moves the landing position between a central portion of an upper surface of the substrate and a peripheral portion of the upper surface of the substrate at a constant speed, when a rotation speed of the substrate is lower than a predetermined speed, and the landing position changing step decreases a moving speed of the landing position as the landing position comes closer to the central portion of the upper surface of the substrate or increases the moving speed of the landing position as the landing position moves away from the central portion of the upper surface of the substrate, when the rotation speed of the substrate is equal to or higher than the predetermined speed.

9. The substrate processing method according to claim 1, wherein the puddle step is a step of holding the liquid film of the phosphoric acid aqueous solution on the substrate and etching the silicon nitride film formed on the substrate while holding the substrate horizontally.

10. The substrate processing method according to claim 1, wherein the pure water supplying step is a step of, in parallel to the puddle step, causing a water nozzle disposed above the substrate and separated from the heater to discharge the pure water to supply the pure water to the liquid film of the phosphoric acid aqueous solution on the substrate while maintaining the state in which the liquid film is boiling.

11. A substrate processing method comprising:

a puddle step of holding a liquid film of a phosphoric acid aqueous solution on a substrate and etching a silicon nitride film formed on the substrate while holding the substrate horizontally;

a liquid film heating step of, in parallel to the puddle step, heating the liquid film of the phosphoric acid aqueous solution on the substrate at a temperature not less than a boiling point of the phosphoric acid aqueous solution at a current concentration of the phosphoric acid aqueous solution and evaporating water contained in the liquid film of the phosphoric acid aqueous solution on the substrate; and a pure water supplying step of, in parallel to the puddle step, supplying a pure water to the liquid film of the phosphoric acid aqueous solution on the substrate at an amount corresponding to an amount of water evaporated from the liquid film of phosphoric acid aqueous solution due to heating in the liquid film heating step while maintaining a state in which the liquid film is boiling.

12. A substrate processing method comprising:

a substrate rotating step of rotating a substrate in a rotation direction;

a puddle step of, in parallel to the substrate rotating step, holding a liquid film of a phosphoric acid aqueous solution on the substrate and etching a silicon nitride film formed on the substrate;

a liquid film heating step of, in parallel to the puddle step, causing a heater disposed above the substrate to heat the liquid film of the phosphoric acid aqueous solution on the substrate at a temperature not less than a boiling point of the phosphoric acid aqueous solution at a current concentration of the phosphoric acid aqueous solution; and a pure water supplying step of, in parallel to the puddle step, causing a water nozzle disposed above the substrate and separated from the heater to discharge a pure water to supply the pure water to the liquid film of the phosphoric acid aqueous solution on the substrate while maintaining a state in which the liquid film is boiling wherein the liquid film heating step includes:

a heating step of, in parallel to the puddle step, partially heating the liquid film of the phosphoric acid aqueous solution on the substrate at the temperature, and a heated position changing step of, in parallel to the heating step, moving a heated position of the liquid film which is heated in the heating step along the liquid film such that the heated position is disposed downstream of a landing position, on which the pure water lands in the pure water supplying step, with respect to the rotation direction.

* * * * *